United States Patent
Kihara et al.

(10) Patent No.: US 9,859,126 B2
(45) Date of Patent: *Jan. 2, 2018

(54) METHOD FOR PROCESSING TARGET OBJECT

(71) Applicant: TOKYO ELECTRON LIMITED, Tokyo (JP)

(72) Inventors: Yoshihide Kihara, Miyagi (JP); Tomoyuki Oishi, Miyagi (JP); Toru Hisamatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/137,095

(22) Filed: Apr. 25, 2016

(65) Prior Publication Data

US 2016/0314982 A1    Oct. 27, 2016

(30) Foreign Application Priority Data

Apr. 27, 2015    (JP) .................. 2015-090158

(51) Int. Cl.
*H01L 21/3065*    (2006.01)
*B44C 1/22*    (2006.01)
(Continued)

(52) U.S. Cl.
CPC ........ *H01L 21/3065* (2013.01); *C23C 16/402* (2013.01); *C23C 16/45534* (2013.01);
(Continued)

(58) Field of Classification Search
None
See application file for complete search history.

(56) References Cited

U.S. PATENT DOCUMENTS 4,987,102 A *    1/1991    Nguyen ............ H01L 21/02129
                                                                    118/50.1
7,204,913 B1    4/2007    Singh et al.
(Continued)

FOREIGN PATENT DOCUMENTS

EP    3 007 205 A1    4/2016
JP    2007-165479 A    6/2007
(Continued)

OTHER PUBLICATIONS

Rowlette, et al., "Digital Control of SiO2 Film Deposition at Room Temperature," The Journal of Physical Chemistry C, 2009, 113, 6906-6909, published on Web Apr. 8, 2009 (4 pages).
(Continued)

*Primary Examiner* — Shamim Ahmed
(74) *Attorney, Agent, or Firm* — Rothwell, Figg, Ernst & Manbeck, P.C.

(57) ABSTRACT

A method for processing a target object by using a capacitively coupled plasma processing apparatus includes a first step of supplying a first gas containing a silicon-containing gas into the processing chamber where a target object is accommodated; a second step of generating a plasma of a rare gas in the processing chamber after executing the first step; a third step of generating a plasma of a second gas containing oxygen gas in the processing chamber after executing the second step; and a fourth step of generating a plasma of a rare gas in the processing chamber after executing the third step. A silicon oxide film is formed by repeatedly executing a sequence including the first step to the fourth step. A negative DC voltage is applied to the upper electrode in at least any one of the second step to the fourth step.

15 Claims, 16 Drawing Sheets

(51) Int. Cl.
*H01L 21/67* (2006.01)
*H01L 21/311* (2006.01)
*H01L 21/033* (2006.01)
*H01L 21/02* (2006.01)
*C23C 16/40* (2006.01)
*C23C 16/455* (2006.01)

(52) U.S. Cl.
CPC .... *C23C 16/45542* (2013.01); *H01L 21/0228* (2013.01); *H01L 21/02164* (2013.01); *H01L 21/02274* (2013.01); *H01L 21/0332* (2013.01); *H01L 21/0337* (2013.01); *H01L 21/31116* (2013.01); *H01L 21/31138* (2013.01); *H01L 21/31144* (2013.01); *H01L 21/67069* (2013.01); *H01J 2237/334* (2013.01)

(56) References Cited

U.S. PATENT DOCUMENTS

| | | | |
|---|---|---|---|
| 9,607,811 B2* | 3/2017 | Kihara | H01J 37/3244 |
| 2006/0037701 A1 | 2/2006 | Koshiishi et al. | |
| 2006/0210723 A1* | 9/2006 | Ishizaka | C23C 16/12 |
| | | | 427/569 |
| 2006/0281337 A1 | 12/2006 | Matsuura | |
| 2008/0081104 A1 | 4/2008 | Hasebe et al. | |
| 2008/0122125 A1* | 5/2008 | Zhou | H01L 21/3088 |
| | | | 257/797 |
| 2010/0124618 A1 | 5/2010 | Kobayashi et al. | |
| 2010/0255625 A1 | 10/2010 | De Vries | |
| 2011/0065280 A1 | 3/2011 | Nakajima et al. | |
| 2011/0237082 A1 | 9/2011 | Nakajima et al. | |
| 2011/0244691 A1 | 10/2011 | Mochiki et al. | |
| 2011/0318931 A1* | 12/2011 | Min | H01L 21/0337 |
| | | | 438/696 |
| 2012/0009802 A1 | 1/2012 | LaVoie et al. | |
| 2013/0023120 A1 | 1/2013 | Yaegashi et al. | |
| 2013/0314015 A1 | 11/2013 | Hoshi et al. | |
| 2014/0053983 A1 | 2/2014 | Sumiya et al. | |
| 2014/0134812 A1* | 5/2014 | Kim | H01L 21/28185 |
| | | | 438/270 |
| 2015/0000842 A1* | 1/2015 | Hirano | G05B 11/01 |
| | | | 156/345.28 |
| 2016/0099148 A1 | 4/2016 | Kihara et al. | |
| 2016/0225639 A1 | 8/2016 | Kihara et al. | |

FOREIGN PATENT DOCUMENTS

| | | |
|---|---|---|
| JP | 2011-82560 A | 4/2011 |
| JP | 2014-53644 A | 3/2014 |
| WO | 2009/101878 A1 | 8/2009 |
| WO | 2012/108079 A1 | 8/2012 |

OTHER PUBLICATIONS

Beynet, et al., "Low Temperature Plasma-Enhanced ALD enables cost-effective Spacer Defined Double Patterning SDDP)," Proc. of SPIE vol. 7520, 75201J, Lithography Asia 2009, Dec. 12, 2009 (7 pages).

* cited by examiner

METHOD FOR PROCESSING TARGET OBJECT

CROSS-REFERENCE TO RELATED APPLICATION

This application claims priority to Japanese Patent Application No. 2015-090158 filed on Apr. 27, 2015, the entire contents of which are incorporated herein by reference.

FIELD OF THE INVENTION

The disclosure relates to a method for processing a target object.

BACKGROUND OF THE INVENTION

In a process of manufacturing an electronic device such as a semiconductor device, plasma processing may be performed on a target object by using a plasma processing apparatus. In the plasma processing, it is required to suppress generation of particles that may cause a product defect.

The particles may be generated from an inner wall surface of the plasma processing apparatus which defines a processing space where a plasma is generated. A solution to suppress the generation of particles from the inner wall surface is to exchange a member that provides the inner wall surface at a regular interval. Another solution to suppress the generation of particles from the inner wall surface is to form a film on the inner wall surface before the plasma processing is performed on the target object. The latter solution, i.e., the technique for forming a film on the inner wall surface before the plasma processing of the target object, is disclosed in Japanese Patent Application Publication Nos. 2014-53644 and 2007-165479, and U.S. Pat. No. 7,204,913.

A plasma etching process is an example of the plasma processing. The plasma etching process is performed to transfer a pattern of a mask on an etching target film to the etching target film. Generally, a resist mask is used as a mask. The resist mask is formed by a photolithography technique. Therefore, a critical dimension of the pattern formed on the etching target film depends on a resolution of the resist mask formed by the photolithography technique. However, the resolution of the resist mask has a limitation. In other words, there is a resolution limit.

Meanwhile, a demand for high integration of electronic device is increasing and it is required to form a pattern smaller than the resolution limit of the resist mask. Therefore, as disclosed in Japanese Patent Application Publication No. 2011-82560, there is suggested a technique for adjusting a size of a resist mask by forming a silicon oxide film on the resist mask and reducing a width of an opening formed by the resist mask.

In the plasma etching using the mask having a size adjusted as described above, the generation of particles needs to be suppressed. Therefore, it is required to form a film on the inner wall surface of the plasma processing apparatus. The film is not necessarily formed on the entire inner wall surface, but may be selectively formed on the inner wall surface. It is also required to prevent a period of time for processing the target object from being increased by the film formation. In other words, the decrease of the throughput needs to be suppressed.

Accordingly, in processing the target object which includes the adjustment of the size of the mask, it is required to selectively form a film on the inner wall surface of the plasma processing apparatus and prevent the decrease of the throughput.

SUMMARY OF THE INVENTION

In accordance with an aspect of the present invention, there is provided a method for processing a target object including mask by using a capacitively coupled plasma processing apparatus, which includes a processing chamber that provides a processing space, a lower electrode, a mounting table for mounting the target object thereon, and an upper electrode having a silicon top plate facing the mounting table with the processing space interposed therebetween, the method including: a first step of supplying a first gas containing a silicon-containing gas into the processing chamber where the target object is accommodated; a second step of generating a plasma of a rare gas in the processing chamber after executing the first step; a third step of generating a plasma of a second gas containing oxygen gas in the processing chamber after executing the second step; and a fourth step of generating a plasma of a rare gas in the processing chamber after executing the third step, wherein a silicon oxide film is formed by repeatedly executing a sequence including the first step to the fourth step, and wherein a negative DC (direct current) voltage is applied to the upper electrode in at least any one of the second step to the fourth step.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
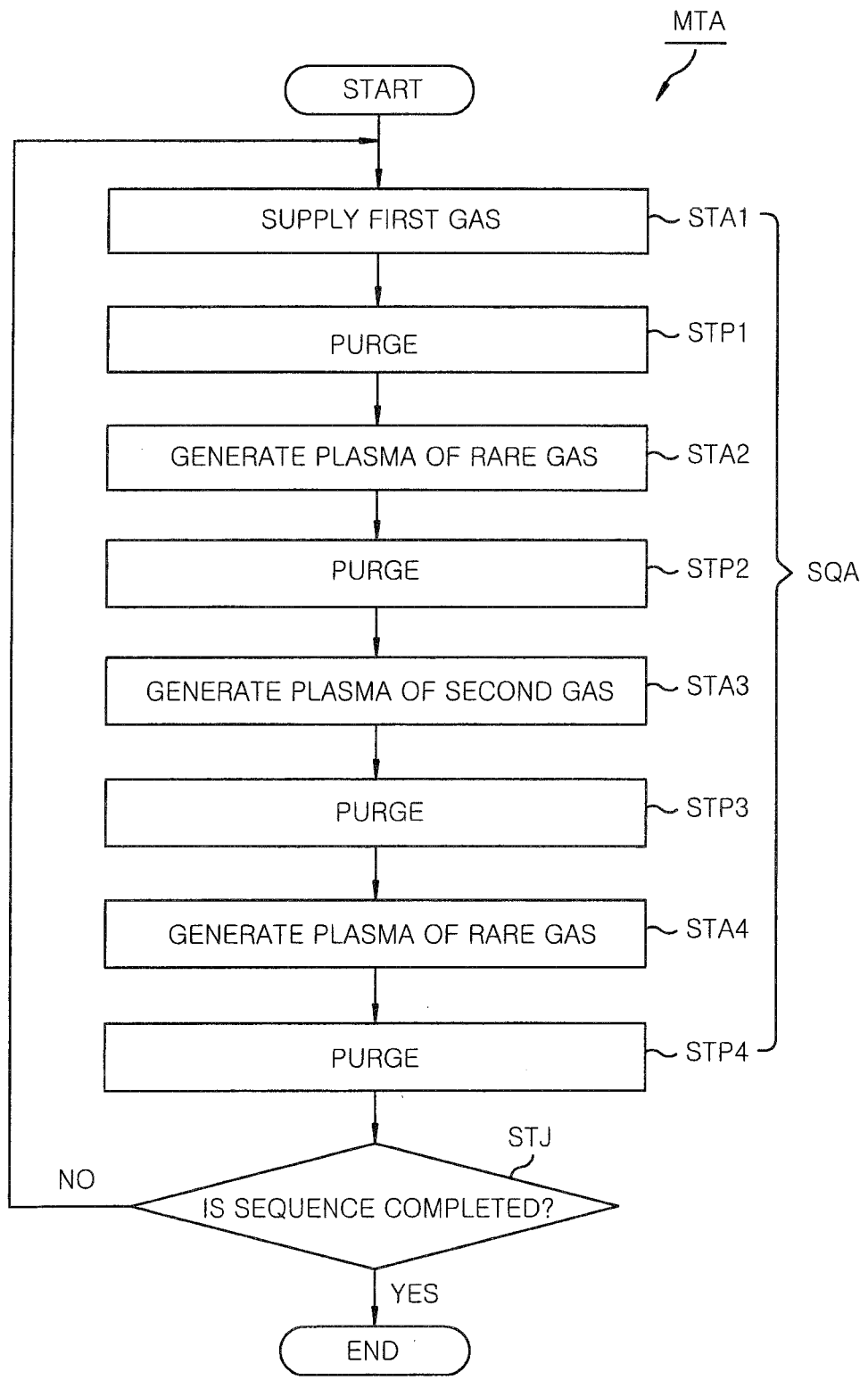
FIG. 1 is a flowchart showing a method for processing a target object according to an embodiment.

Hereinafter, various embodiments will be described in detail with reference to the accompanying drawings. Further, like reference numerals will be used for like or corresponding parts throughout the drawings.

FIG. 1 is a flowchart showing a method for processing a target object according to an embodiment. A method MTA shown in FIG. 1 includes a process of reducing an opening width of a resist mask by adjusting a size of the resist mask of a target object (hereinafter, may be referred to as "wafer W"). In the method MTA according to an embodiment, a series of steps can be performed by using a single plasma processing apparatus.

Figure 2:
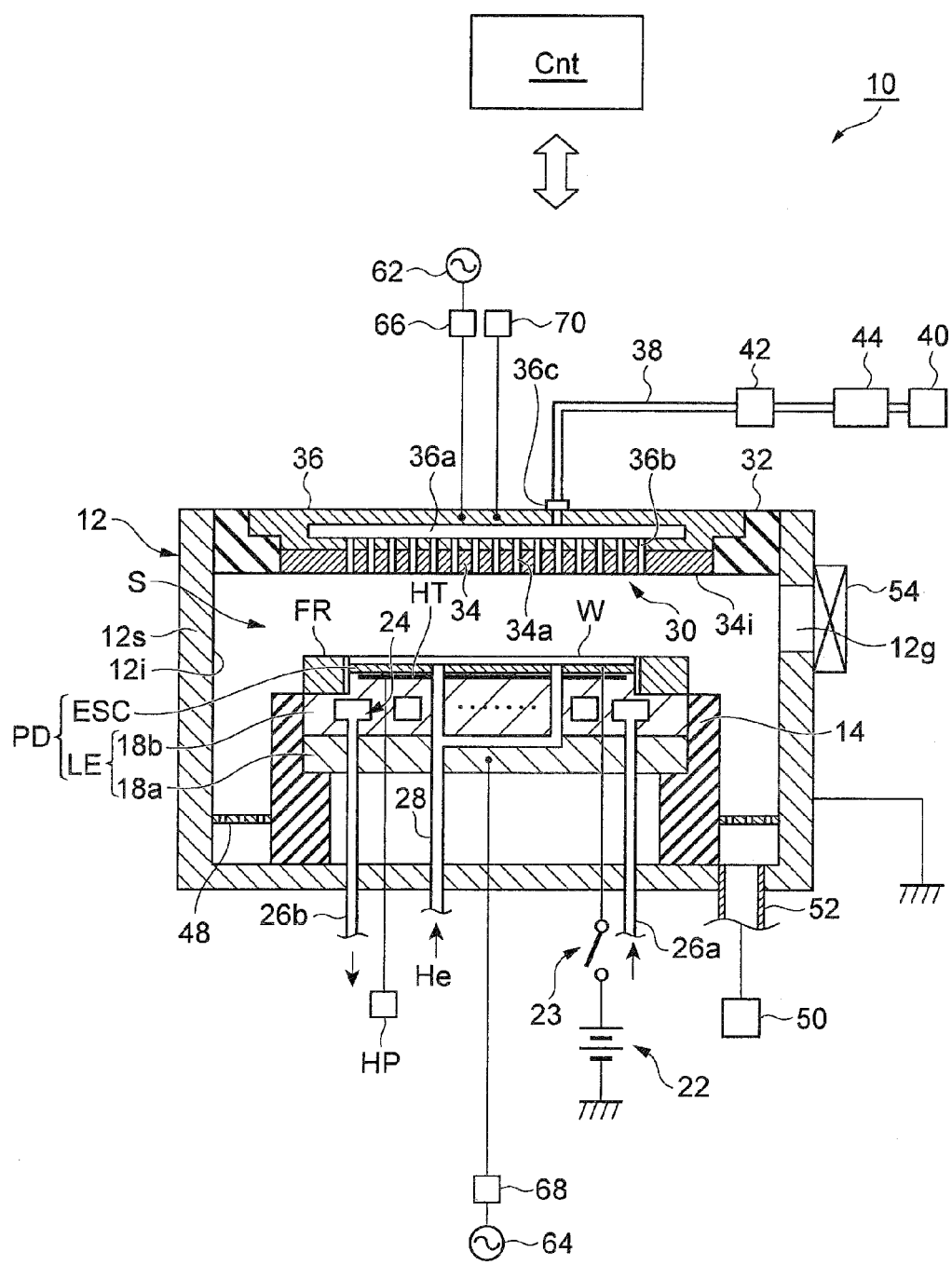
FIG. 2 shows an example of a plasma processing apparatus.

FIG. 2 shows an example of a plasma processing apparatus. In FIG. 2, there is illustrated a schematic cross sectional structure of a plasma processing apparatus 10 that can be used for various embodiments of a method for processing a target object. The plasma processing apparatus 10 shown in FIG. 2 is a capacitively coupled plasma etching apparatus. The plasma processing apparatus 10 includes a processing chamber 12. The processing chamber 12 has a substantially cylindrical shape. The processing chamber 12 is made of, e.g., aluminum. An inner wall surface of the processing chamber 12, i.e., a wall surface that defines an inner space of the processing chamber 12, is anodically oxidized. Further, the inner wall surface of the processing chamber 12 may be coated with a ceramic material such as yttrium oxide. A loading/unloading port 12g for the wafer W is provided at a sidewall 12s of the processing chamber 12. The loading/unloading port 12g can be opened and closed by a gate valve 54. The processing chamber 12 is grounded.

A mounting table PD is provided in the processing chamber 12. The mounting table PD holds the wafer W on a top surface thereof. The mounting table PD includes a supporting portion 14, a lower electrode LE, and an electrostatic chuck ESC. The supporting portion 14 has a substantially cylindrical shape and is made of an insulating material such as quartz. In the processing chamber 12, the supporting portion 14 extends vertically from a bottom portion of the processing chamber 12. The supporting portion 14 supports the lower electrode LE and the electrostatic chuck ESC.

The lower electrode LE includes a first plate 18a and a second plate 18b. The first plate 18a and the second plate 18b are made of a metal, e.g., aluminum, and has a substantially disc shape. The second plate 18b is provided on the first plate 18a and electrically connected to the first plate 18a.

The electrostatic chuck ESC is provided on the second plate 18b. The electrostatic chuck ESC has a structure in which an electrode that is a conductive film is embedded between a pair of insulating layers or insulating sheets. A DC power supply 22 is electrically connected to the electrode of the electrostatic chuck ESC via a switch 23. The wafer W is attracted and held on the electrostatic chuck ESC by an electrostatic force such as a Coulomb force or the like which is generated by a DC voltage applied from the DC power supply 22. Accordingly, the wafer W can be held on the electrostatic chuck ESC.

A focus ring FR is provided on a peripheral portion of the second plate 18b to surround an edge of the wafer W and the electrostatic chuck ESC. The focus ring FR is provided to improve uniformity of the plasma processing. The focus ring FR is made of a material that is appropriately selected depending on types of plasma processing. For example, the focus ring FR is made of, e.g., quartz.

The second plate 18b has therein a coolant channel 24. The coolant channel 24 constitutes a temperature control mechanism. A coolant is supplied into the coolant channel from a chiller unit provided outside the processing chamber 12 through a line 26a. The coolant supplied to the coolant channel 24 returns to the chiller unit through a line 26b. The coolant circulates through the coolant channel 24. By controlling the temperature of the coolant, the temperature of the wafer W supported by the electrostatic chuck ESC is controlled.

The plasma processing apparatus 10 further includes a gas supply line 28. A heat transfer gas, e.g., He gas is supplied through the gas supply line 28 from a heat transfer gas supply mechanism to a gap between a top surface of the electrostatic chuck ESC and a backside of the wafer W.

The plasma processing apparatus 10 further includes a heater HT as a heating element. The heater HT is installed in, e.g., the second plate 18b. The heater HT is connected to a heater power supply HP. By supplying power from the heater power supply HP to the heater HT, the temperature of the mounting table PD is controlled to adjust the temperature of the wafer W mounted on the mounting table PD. The heater HT may be installed in the electrostatic chuck ESC.

The plasma processing apparatus 10 includes an upper electrode 30. The upper electrode 30 is provided above the mounting table PD to face the mounting table PD. The lower electrode LE and the upper electrode 30 are arranged in parallel to each other.

The upper electrode 30 is supported at an upper portion of the processing chamber 12 through an insulating shielding member 32. The insulating shielding member 32 is made of an insulating material, e.g., quartz. The upper electrode 30 includes a top plate 34 and an electrode holder 36. The top plate 34 faces the processing space S and has a plurality of gas injection holes 34a. The top plate 34 is made of silicon.

The electrode holder 36 detachably holds the top plate 34 and may be made of a conductive material, e.g., aluminum. The electrode holder 36 may have a water cooling structure. The electrode holder 36 has therein a gas diffusion space 36a. A plurality of gas holes 36b communicating with the gas injection holes 34a extends downward from the gas diffusion space 36a. The electrode holder 36 has a gas inlet port 36c for guiding a processing gas into the gas diffusion space 36a. A gas supply line 38 is connected to the gas inlet port 36c.

A gas source group 40 is connected to the gas supply line 38 via a valve group 42 and a flow rate controller group 44. The gas source group 40 includes a plurality of gas sources. The gas sources may include a silicon-containing gas source, an oxygen gas source, a nitrogen gas source, a fluorocarbon gas source, a rare gas source, and an inert gas source. In one embodiment, the silicon-containing gas is an aminosilane gas. In another embodiment, the silicon-containing gas is a halogenated silicon gas. As the halogenated silicon gas, $SiCl_4$ gas may be used, for example. Further, as the halogenated silicon gas, it is possible to use $SiBr_4$ gas, SiF$_4$ gas, or SiH$_2$Cl$_4$ gas. As a fluorocarbon gas, any fluorocarbon gas such as CF$_4$ gas, C$_4$F$_6$ gas, or C$_4$F$_8$ gas may be used. As a rare gas, any rare gas such as He gas, Ne gas, Ar gas, or Kr gas may be used. The inert gas may be, but not limited to, nitrogen gas.

The valve group 42 includes a plurality of valves. The flow rate controller group 44 includes a plurality of flow rate controllers such as mass flow controllers. The gas sources of the gas source group 40 are connected to the gas supply line 38 via corresponding valves of the valve group 42 and corresponding flow rate controllers of the flow rate controller group 44. Therefore, the plasma processing apparatus 10 can supply gases from one or more gas sources selected among the gas sources of the gas source group 40 into the processing chamber 12 at controlled flow rates.

In the processing chamber 12, a gas exhaust plate 48 is provided between the supporting portion 14 and the sidewall 12s of the processing chamber 12. The gas exhaust plate 48 may be formed by coating ceramic such as yttrium oxide on aluminum, for example. The gas exhaust plate 48 has a plurality of through-holes. Under the gas exhaust plate 48, a gas exhaust line 52 is connected to the bottom portion of the processing chamber 12. A gas exhaust unit 50 is connected to the gas exhaust line 52. The gas exhaust unit 50 has a vacuum pump such as a turbo molecular pump or the like and thus can depressurize the space in the processing chamber 12 to a desired vacuum level.

The plasma processing apparatus 10 further includes a first high frequency power supply 62 and a second high frequency power supply 64. The first high frequency power supply 62 generates a first high frequency power for plasma generation having a frequency ranging from 27 MHz to 100 MHz, e.g., 40 MHz in this example. The first high frequency power supply 62 is connected to the upper electrode 30 via a matching unit 66. The matching unit 66 is a circuit for matching an output impedance of the first high frequency power supply 62 with an input impedance of a load side (the upper electrode 30 side). The first high frequency power supply 62 may be connected to the lower electrode LE via the matching unit 66.

The second high frequency power supply 64 generates a second high frequency power for attracting ions to the wafer W, i.e., a high frequency bias power, which has a frequency ranging from 400 kHz to 13.56 MHz, e.g., 3.2 MHz in this example. The second high frequency power supply 64 is connected to the lower electrode LE via a matching unit 68. The matching unit 68 is a circuit for matching an output impedance of the second high frequency power supply 64 with an input impedance of a load side (the lower electrode LE side).

The plasma processing apparatus 10 further includes a power supply 70. The power supply 70 is connected to the upper electrode 30. The power supply 70 applies a negative DC voltage, for attracting positive ions in the processing space S to the top plate 34, to the upper electrode 30.

When the plasma processing is performed by the plasma processing apparatus 10, a gas from a gas source selected among a plurality of gas sources of the gas source group 40 is supplied into the processing chamber 12. The gas supplied into the processing chamber 12 is excited by a high frequency electric field generated by the high frequency power from the first high frequency power supply 62. Accordingly, a plasma is generated in the processing space S in the processing chamber 12. The processing space S is a space where a plasma is generated in the plasma processing apparatus 10. The processing space S is disposed above the gas exhaust plate 48 in the processing chamber 12. The inner wall surface of the plasma processing apparatus 10 which defines the processing space S includes an inner wall surface 12i of the sidewall 12s of the processing chamber 12, the surface of the mounting table PD, and a bottom surface 34i of the top plate 34. When a plasma is generated in the processing space S, the wafer W mounted on the mounting table PD is processed by active species such as ions and radicals. When the ions need to be attracted to the wafer W in the plasma processing, the high frequency bias power from the second high frequency power supply 64 may be applied to the lower electrode LE during the plasma processing. When the positive ions need to be attracted to the upper electrode 30 in the plasma processing, a negative DC voltage may be applied from the power supply 70 to the upper electrode 30 during the plasma processing.

In the present embodiment, the plasma processing apparatus 10 may further include a control unit Cnt. The control unit Cnt is a computer including a processor, a storage unit, an input device, a display device, and the like. The control unit Cnt controls the respective components of the plasma processing apparatus 10. Specifically, the control unit Cnt is connected to the valve group 42, the flow rate controller group 44, the gas exhaust unit 50, the first high frequency power supply 62, the matching unit 66, the second high frequency power supply 64, the matching unit 68, the power supply 70, the heater power supply HP, and the chiller unit.

The control unit Cnt operates in accordance with a program based on an inputted recipe and transmits control signals. The supply of gases from the gas source group 40, the exhaust operation of the gas exhaust unit 50, the supply of high frequency powers from the first and the second high frequency power supply 62 and 64, the application of the voltage from the power supply 70, the supply of power from the heater power supply HP, a flow rate and a temperature of a coolant from the chiller unit are controlled by the control signals from the control unit Cnt. Each step of the method for processing a target object which is disclosed in this specification can be executed by operating the respective components of the plasma processing apparatus 10 under the control of the control unit Cnt.

Figure 3A:
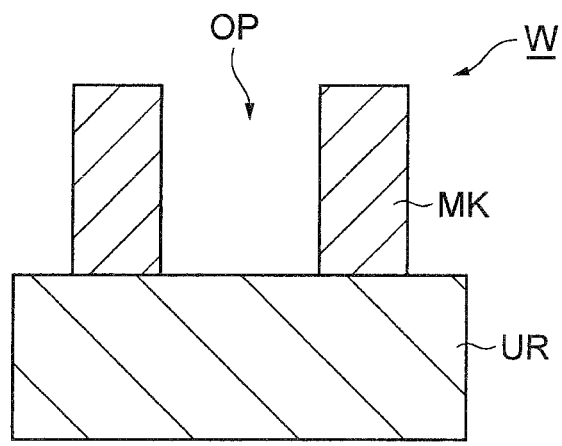
FIGS. 3A and 3B are cross sectional views schematically showing a state of the target object and a state of the plasma processing apparatus before the implementation of the method shown in FIG. 1.
Figure 3B:
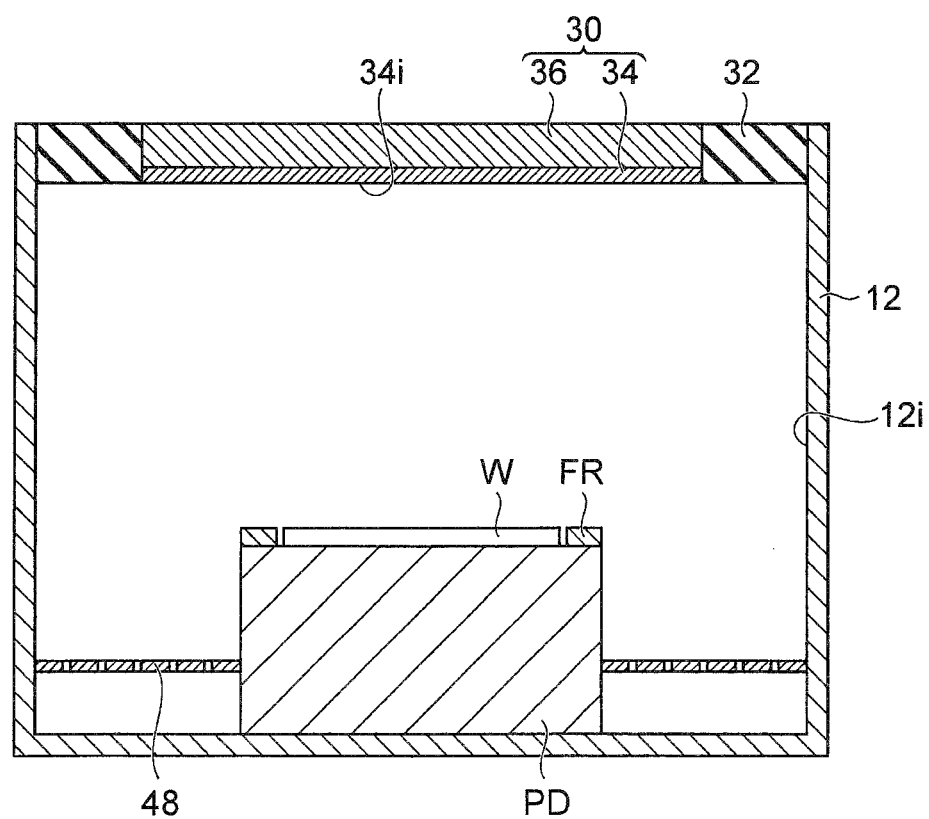
Figure 4A:
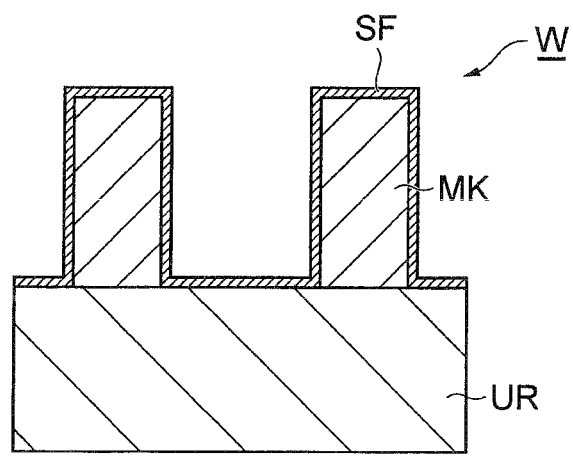
FIGS. 4A and 4B are cross sectional views schematically showing a state of the target object and a state of the plasma processing apparatus during the implementation of the method shown in FIG. 1.
Figure 4B:
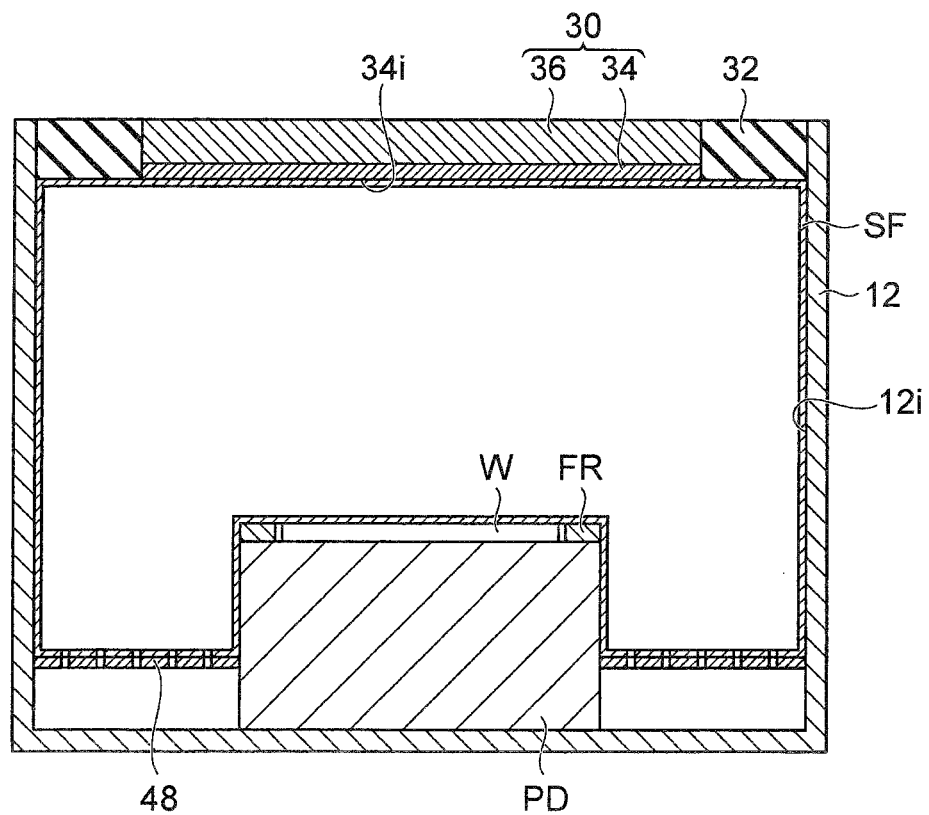
Figure 5:
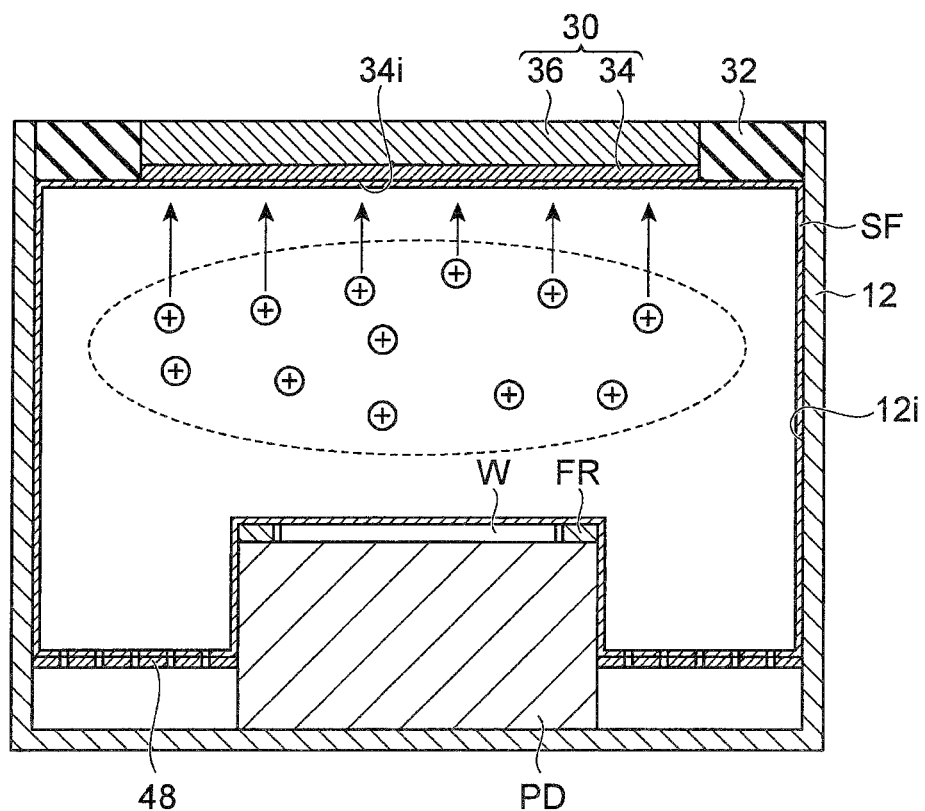
FIG. 5 shows a behavior of positive ions in the case of applying a negative DC (direct current) voltage to an upper electrode.
Figure 6A:
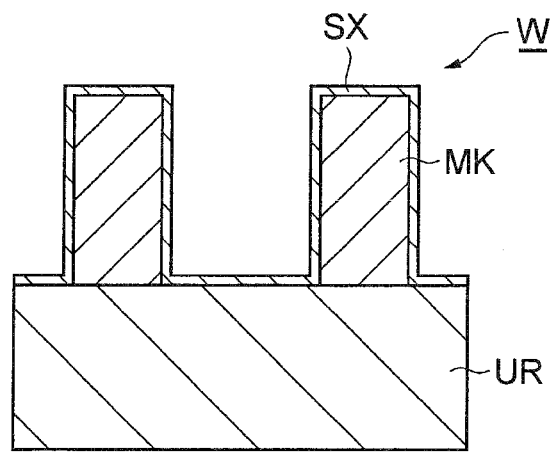
FIGS. 6A and 6B are cross sectional views schematically showing a state of the target object and a state of the plasma processing apparatus during the implementation of the method shown in FIG. 1.
Figure 6B:
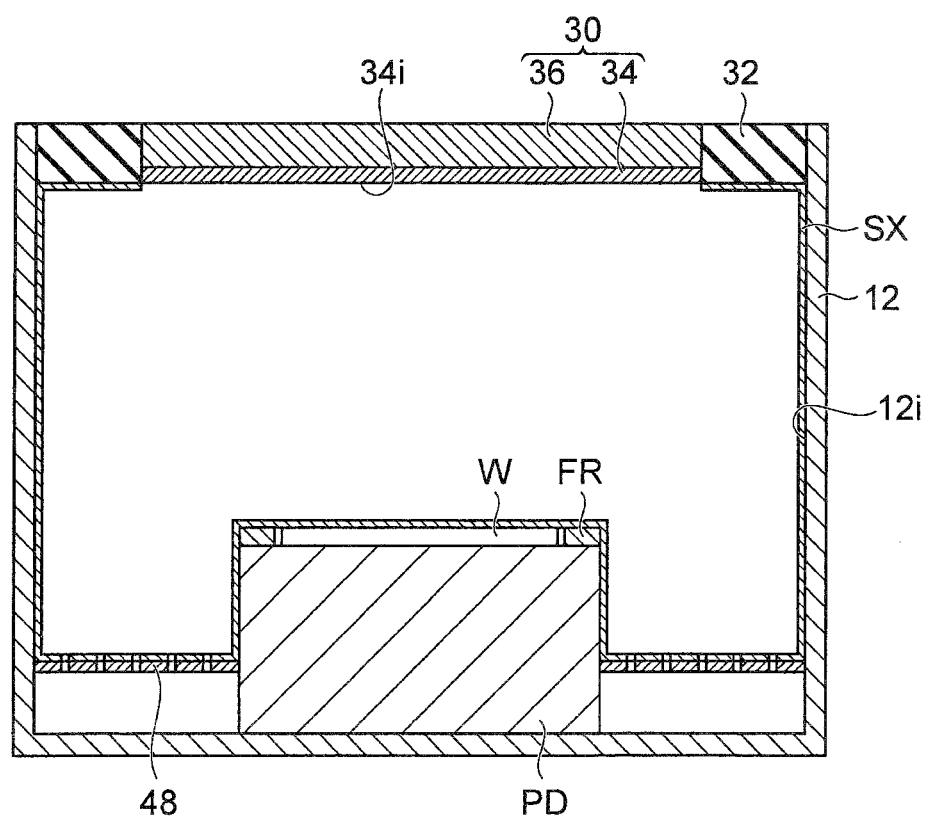
Figure 7A:
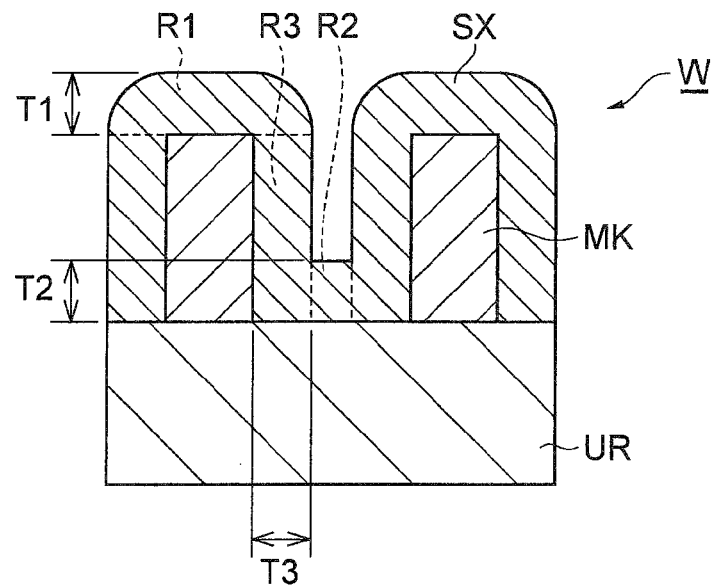
FIGS. 7A and 7B are cross sectional views schematically showing a state of the target object and a state of the plasma processing apparatus after the implementation of the method shown in FIG. 1.
Figure 7B:
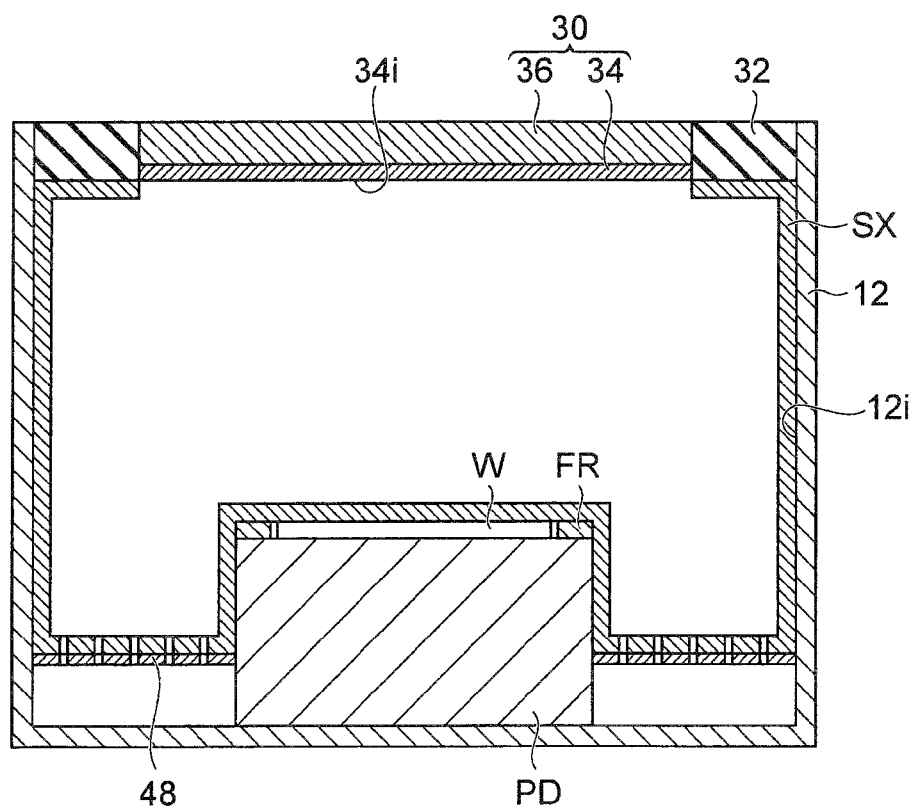
Figure 8:
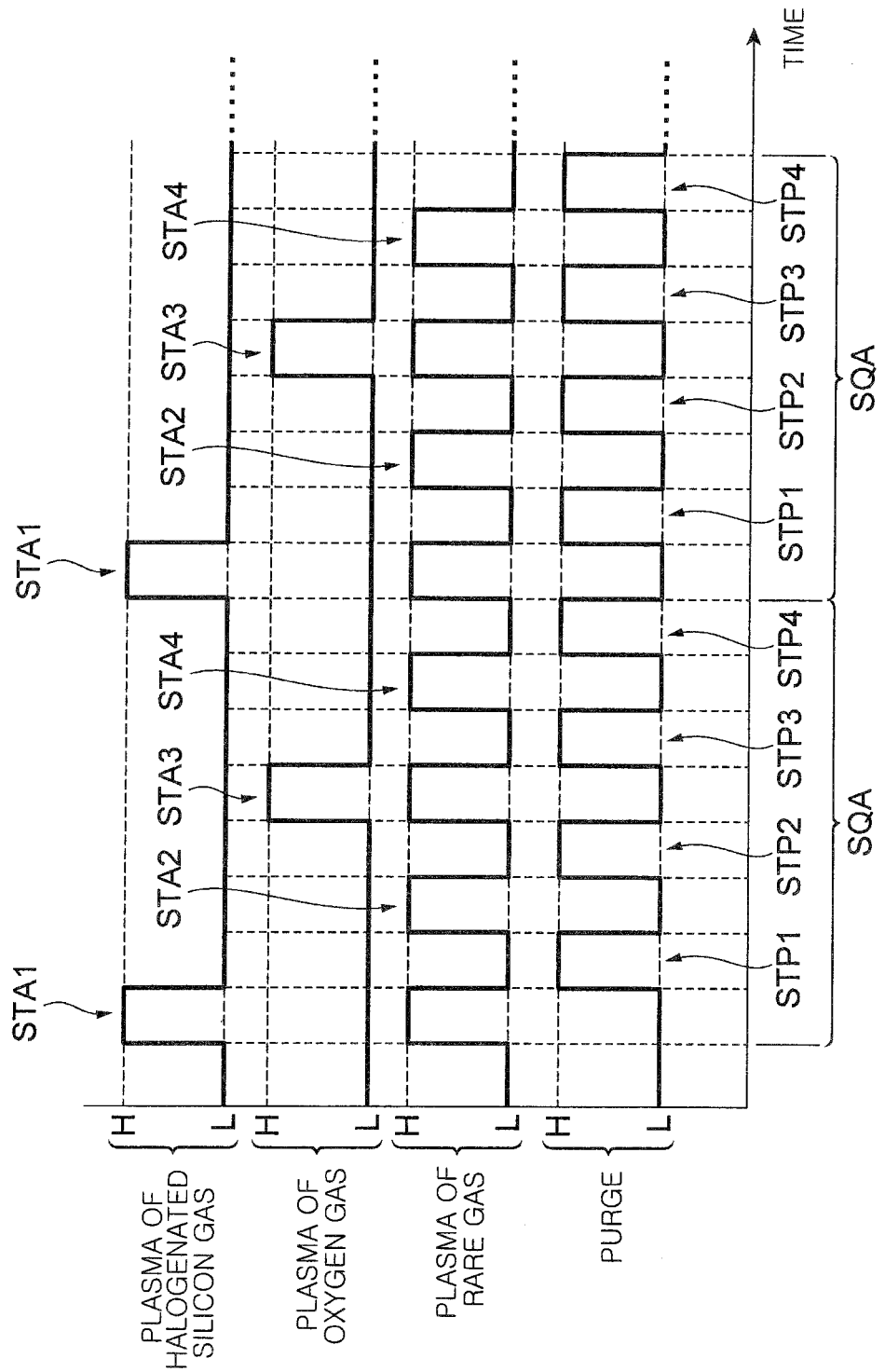
FIG. 8 shows timing charts of the method shown in FIG. 1.

Referring back to FIG. 1, the method MTA will be described in detail. Hereinafter, an example in which the plasma processing apparatus 10 is used for implementing the method MTA will be described. In the following description, FIGS. 3A to 8 will be referred to. FIGS. 3A and 3B are cross sectional views schematically showing a state of a target object and a state of the plasma processing apparatus before the implementation of the method shown in FIG. 1. FIGS. 4A, 4B, 6A and 6B are cross sectional views showing a state of the target object and a state of the plasma processing apparatus during the execution of the method shown in FIG. 1. FIG. 5 shows a behavior of positive ions in the case of applying a negative DC voltage to the upper electrode. FIGS. 7A and 7B are cross sectionals view schematically showing a state of the target object and a state of the plasma processing apparatus after completion of the execution of the method shown in FIG. 1. FIG. 8 shows timing charts of the method shown in FIG. 1. In FIG. 8, there are illustrated the timing charts of the generation of the plasma of the halogenated silicon gas, the generation of the plasma of the oxygen gas, the generation of the plasma of the rare gas, and the execution of the purge process. In the timing chart of the plasma generation of FIG. 8, a high level (indicated by "H" in the drawing) shows the state in which a plasma of each gas is being generated, and a low level (indicated by "L" in the drawing) shows the state in which a plasma of each gas is not being generated. In FIG. 8, there is also illustrated the timing chart of the purge process. In the timing chart of the purge process, a high level (indicated by "H" in the drawing) indicates a state in which a purge process is being performed, whereas a low level (indicated by "L" in the drawing) indicates a state in which a purge process is not being performed.

In the method MTA shown in FIG. 1, first, a wafer W shown in FIG. 3A is prepared. The wafer W includes a base region UR and a mask MK. The base region UR is a base of the mask MK and includes an etching target layer. In the method MTA, the wafer W is accommodated in the processing chamber 12 of the plasma processing apparatus 10 and mounted on the mounting table PD as shown in FIG. 3B.

In the method MTA, a sequence SQA is repeatedly executed. The sequence SQA includes steps STA1 to STA4. The sequence SQA may further include steps STP1 to STP4 for a purge process.

As shown in FIG. 1, in the step STA1, a first gas is supplied into the processing chamber 12. In an embodiment of the step STA1, the first gas contains a halogenated silicon gas as a silicon-containing gas. The first gas contains, e.g., $SiCl_4$ gas, as the halogenated silicon gas. Further, the first gas may contain $SiBr_4$ gas, $SiF_4$ gas or $SiH_2Cl_4$ gas as the halogenated silicon gas. The first gas may further contain a rare gas such as He gas, Ne gas, Ar gas, or Kr gas.

In the embodiment of the step STA1 in which the first gas contains a halogenated silicon as a silicon-containing gas, a plasma of the first gas is generated as shown in FIG. 8. Specifically, in the step STA1, the first gas (halogenated silicon gas and rare gas) is supplied from a gas source selected among a plurality of gas sources of the gas source group 40 into the processing chamber 12. By operating the gas exhaust unit 50, a pressure in the space in the processing chamber 12 is set to a predetermined level. Further, a high frequency power is supplied from the first high frequency power supply 62. Accordingly, the plasma of the first gas is generated. When the plasma of the first gas is generated in the step STA1, a reactant precursor such as dissociated species of halogenated silicon contained in the first gas is generated. The generated precursor is adhered onto the wafer W, so that a silicon-containing film SF is formed on the surface of the wafer W as shown in FIG. 4A. The generated precursor also forms a silicon-containing film SF on the inner wall surface of the plasma processing apparatus 10 such as the inner wall surface 12i of the processing chamber 12 and the bottom surface 34i of the top plate 34 as shown in FIG. 4B.

In another embodiment of the step STA1, the first gas contains an aminosilane gas as a silicon-containing gas. In this embodiment in which the first gas contains an aminosilane gas, no plasma is generated in the step STA1. Also, in the embodiment using the first gas containing an aminosilane gas, a silicon-containing film SF can be formed on the surface of the wafer W and the inner wall surface of the plasma processing apparatus 10, as in the case of the embodiment in which the plasma of the first gas containing a halogenated silicon gas is generated.

Next, in the step STP1, the space in the processing chamber 12 is purged as shown in FIGS. 1 and 8. Specifically, the first gas supplied in the step STA1 is exhausted. In the step STP1, an inert gas such as nitrogen gas may be supplied as a purge gas into the processing chamber 12 of the plasma processing apparatus 10. In other words, in the step STP1, either one or both of a gas purge process of purging the inside of the processing chamber 12 with an inert gas and a vacuum suction purge process using vacuum suction is executed. In the step STP1, a precursor excessively adhered onto the wafer W is removed.

Next, in the step STA2, a plasma of a rare gas such as He gas, Ne gas, Ar gas or Kr gas is generated in the processing chamber 12. Specifically, in the step STA2, the rare gas is supplied from a gas source selected among a plurality of gas sources of the gas source group 40 into the processing chamber 12. By operating the gas exhaust unit 50, a pressure in the space in the processing chamber 12 is set to a predetermined level. Further, a high frequency power is supplied from the first high frequency power supply 62. Accordingly, a plasma of the rare gas is generated. Next, in a step STP2, the space in the processing chamber 12 is purged as in the case of the step STP1.

Next, in a step STA3, a plasma of a second gas containing oxygen gas is generated in the processing chamber 12. In one embodiment, the second gas contains, in addition to oxygen gas, a rare gas such as He gas, Ne gas, Ar gas, or Kr gas. In the step STA3, as shown in FIG. 8, a plasma of the oxygen gas and a plasma of the rare gas are generated. Specifically, in the step STA3, the second gas is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62. In an embodiment of the step STA3, a negative DC voltage is applied from the power supply 70 to the upper electrode 30. The negative DC voltage applied from the power supply 70 to the upper electrode 30 is −500 V or less.

As shown in FIG. 5, in the step STA3, a plasma of the second gas is generated. Positive ions (indicated by "+" in circles in the drawing) collide with the silicon-containing film SF formed on the bottom surface 34i of the top plate 34 by the negative DC voltage applied to the upper electrode 30. Accordingly, as shown in FIG. 6B, the silicon-containing film SF formed on the bottom surface 34i of the top plate 34 is removed. Meanwhile, the silicon-containing film SF formed on an inner wall surface of the plasma processing apparatus 10 except the bottom surface 34i of the top plate 34, i.e., the inner wall surface 12i of the processing chamber 12 or the like, is modified to a silicon oxide film SX by reaction with oxygen. As shown in FIG. 6A, the silicon-containing film SF on the wafer W is also modified to a silicon oxide film SX.

Next, in the step STP3, the space in the processing chamber 12 is purged as in the case of the steps STP1 and STP2. Then, in the step STA4, a plasma of a rare gas is generated in the processing chamber 12 as in the case of the step STA2. Thereafter, in the step STP4, the space in the processing chamber 12 is purged as in the case of the steps STP1 to STP3.

Next, in a step STJ, it is determined whether or not the execution of the sequence SQA is completed. Specifically, in the step STJ, it is determined whether or not the number of execution of the sequence SQA has reached a predetermined number. The number of execution of the sequence SQA determines a film thickness of the silicon oxide film SX formed on the inner wall surface of the plasma processing apparatus 10 and the surface of the wafer W. In other words, a final film thickness of the silicon oxide film SX is substantially determined by multiplying the film thickness of the silicon oxide film formed by one execution of the sequence SQA by the number of execution of the sequence SQA. Therefore, the number of execution of the sequence SQA is set depending on a desired film thickness of the silicon oxide film to be formed on the surface of the wafer W.

When it is determined in the step STJ that the number of execution of the sequence SQA has not reached the predetermined number, the execution of the sequence SQA is repeated from the step STAT again. On the other hand, it is determined in the step STJ that the number of execution of the sequence SQA has reached the predetermined number, the execution of the sequence SQA is completed. By repeating the sequence SQA, a silicon oxide film SX having a desired film thickness is formed on the surface of the wafer W as shown in FIG. 7A. As shown in FIG. 7B, the silicon oxide film SX is selectively formed on the inner wall surface of the plasma processing apparatus 10 except the bottom surface 34i of the top plate 34, i.e., on the inner wall surface 12i of the processing chamber 12 and the like.

In this method MTA, since the film thickness of the silicon oxide film SX can be adjusted to a desired thickness determined by the number of execution of the sequence SQA, an opening width of the mask MK can be adjusted to a desired width by controlling the size of the mask MK. Further, the silicon oxide film SX can be selectively formed on the inner wall surface of the plasma processing apparatus 10 except the bottom surface 34i of the top plate 34. Since the silicon oxide film SX can be selectively formed on the inner wall surface of the plasma processing apparatus 10 during the execution of the sequence SQA for controlling the size of the mask MK, the decrease of the throughput can be suppressed.

Although the example in which the negative DC voltage is applied from the power supply 70 to the upper electrode in the step STA3 has been described, the negative DC voltage may be applied from the power supply 70 to the upper electrode 30 in at least any one of the steps STA2, STA3 and STA4. Accordingly, the film formed on the bottom surface 34i of the top plate 34 can be selectively removed during the execution of the sequence SQA.

In the method MTA, in the step STA2 between the steps STA1 and STA3, bonding in the surfaces of the precursors of the silicon-containing film SF is activated by active species of rare gas atoms. In the step STA4, bonding in the surface of the silicon oxide film SX is activated. As a consequence, oxygen deficiency in the Si—O network in the silicon oxide film SX is solved. Accordingly, the formed silicon oxide film SX becomes dense. Therefore, even in the case of the wafer W having a mask MK that provides an opening having a high aspect ratio, the silicon oxide film SX having high in-plane uniformity and a conformal coverage is conformally formed on the surface of the wafer W. In other words, the variation of the film thickness of the silicon oxide film SX formed on the surface of the wafer W is reduced.

More specifically, as shown in FIG. 7A, the silicon oxide film SX formed on the wafer W includes regions R1 to R3. The region R3 extends along the side surface of the mask MK, i.e., the side surface that defines the opening OP, on the corresponding side surface. The region R1 extends on the top surface of the mask MK and the region R3. The region R2 extends between the adjacent regions R3 and on the surface of the base region UR. By using the method MTA, even in the case of the wafer W including the mask MK that provides an opening OP having a high aspect ratio, the difference in the film thicknesses T1 to T3 of the silicon oxide films in the regions R1 to R3 can be reduced.

In an embodiment of the step STA1, a halogenated silicon gas is used as a gas for precursor. The halogenated silicon gas, e.g., $SiCl_4$ gas, $SiBr_4$ gas, $SiF_4$ gas or $SiH_2Cl_4$ gas, is in a vaporized state at a room temperature. Therefore, in this embodiment of the step STA1, a precursor containing silicon can be deposited on the wafer W and the inner wall surface of the plasma processing apparatus 10 without using a dedicated film forming apparatus having a vaporizer.

In the embodiment in which a halogenated gas is used as a gas for precursor, a pressure in the processing chamber 12 during the execution of the step STA1 is set to 13.33 Pa (100 mTorr) or above but not limited thereto. Further, a high frequency power of the first high frequency power supply 62 during the execution of the step STA1 is set to 100 W or less. By generating a plasma under the condition of a high pressure and a low power, excessive dissociation of the halogenated silicon gas can be suppressed. In order to generate a plasma state identical to that obtained by suppressing the excessive dissociation, the second high frequency power supply 64 may be used. Accordingly, it is possible to suppress the damage to the mask MK and/or the damage to the silicon oxide film that has been already formed. It is also possible to reduce the difference in the film thickness between the regions R1 to R3. When there are a region where the mask MK is densely formed and a region where the mask MK is sparsely formed, i.e., when the density of the pattern of the mask MK is not uniform, it is possible to reduce a difference in the film thickness of the silicon oxide film between both regions.

In the embodiment using a halogenated gas as a gas for precursor, when the step STA1 is executed, a high frequency bias power is hardly supplied or not supplied to the lower electrode LE from the second high frequency power supply 64. This is because an anisotropic component is generated when the high frequency bias power is applied. By minimizing the high frequency bias power, the precursor can be isotropically adhered onto the wafer W. As a result, the uniformity of the film thickness of the silicon oxide films formed on the top surface of the mask MK, the silicon oxide film formed on the side surface of the mask MK and the silicon oxide film formed on the surface of the base of the mask MK is further improved. In the case of generating a plasma by using the second high frequency power supply 64, it is required to select a condition that minimizes the ion energy to isotropically adhere the precursor. When the step STA3 is executed, isotropic reaction identical to that in the step STA1 is required to substitute the precursor adhered in the step STA1 with a silicon oxide film. Therefore, in the step STA3, the high frequency bias power from the second high frequency power supply 64 is hardly supplied or not supplied to the lower electrode LE.

Figure 9:
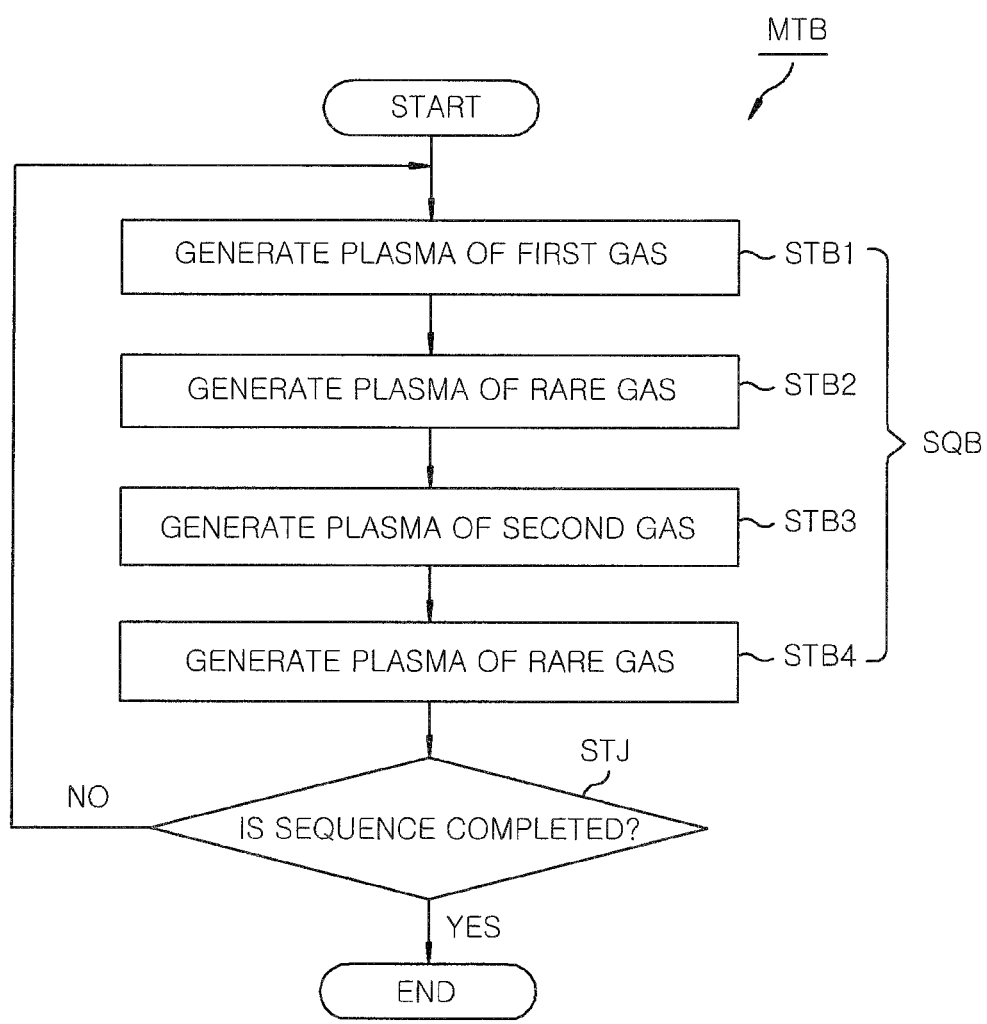
FIG. 9 is a flowchart showing a method for processing a target object according to another embodiment.
Figure 10:
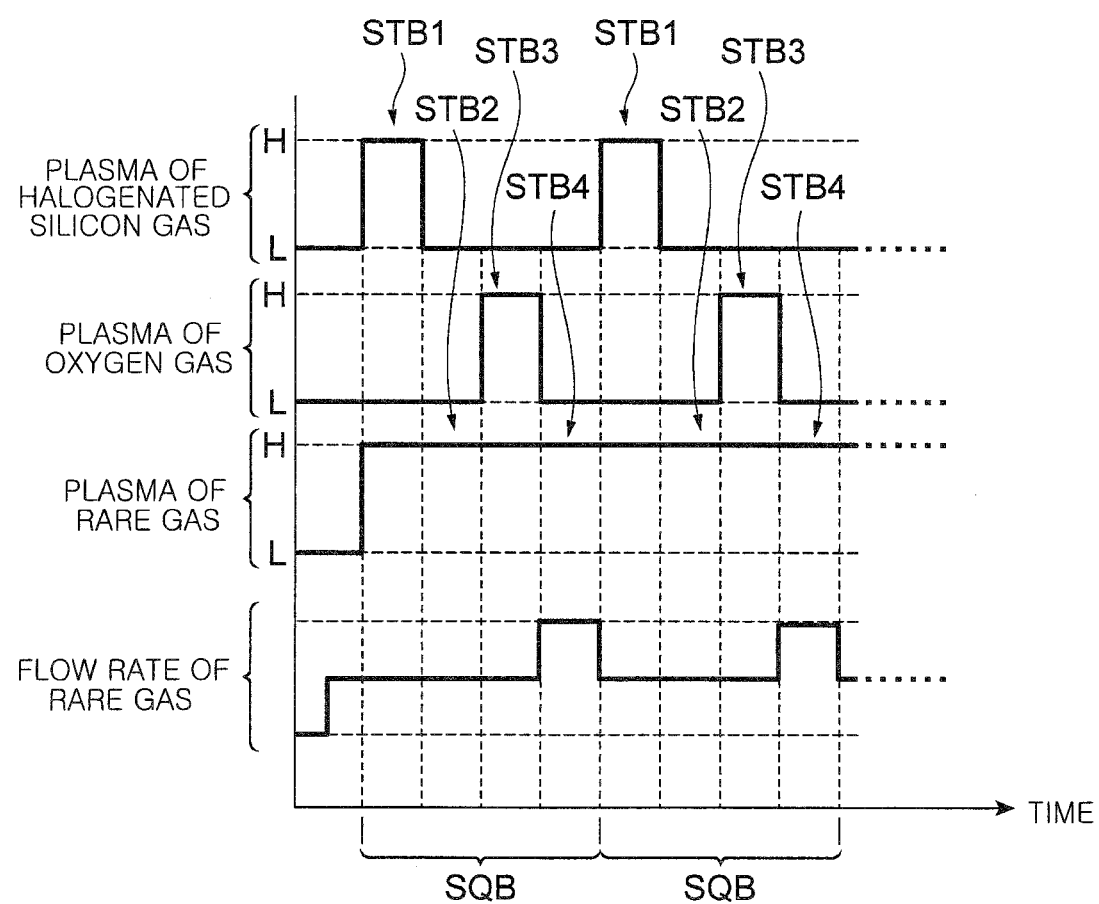
FIG. 10 shows timing charts of a flow rate of a rare gas and generation of a plasma in the method shown in FIG. 9.

Hereinafter, another embodiment of the method for processing a target object will be described. FIG. 9 is a flowchart showing the method for processing a target object according to another embodiment. FIG. 10 shows timing charts of the generation of the plasma and the flow rate of the rare gas in the method shown in FIG. 9. In FIG. 10, there are illustrated the timing charts of the generation of a plasma of a halogenated silicon gas, a plasma of oxygen gas, and a plasma of a rare gas. In the timing chart of the plasma generation of FIG. 10, a high level (indicated by "H" in the drawing) indicates a state in which a plasma of each gas is being generated, whereas a low level (indicated by "L" in the drawing) indicates a state in which a plasma of each gas is not being generated. In FIG. 10, there is also illustrated the timing chart of a flow rate of the rare gas supplied into the processing chamber 12 of the plasma processing apparatus 10. The timing chart of the flow rate of the rare gas shows that the flow rate of the rare gas is greater at the high level.

In a method MTB shown in FIG. 9, a silicon oxide film SX is formed on the surface of the wafer W by repeating the execution of the sequence SQB. In the step STJ of the method MTB, it is determined whether or not the execution of the sequence is completed as in the step STJ of the method MTA.

The sequence SQB includes steps STB1 to STB4. The step STB1 is the same as the step STA1 of the sequence SQA. In the step STB1, a plasma of the first gas containing a halogenated silicon gas and a rare gas is generated in the processing chamber 12 of the plasma processing apparatus 10. The step STB2 is the same as the step STA2 of the sequence SQA. In the step STB2, a plasma of the rare gas is generated in the processing chamber 12. The step STB3 is the same as the step STA3 of the sequence SQA. In the step STB3, a plasma of the second gas is generated in the processing chamber 12. The step STB4 is the same as the step STA4 of the sequence SQA. In the step STB4, a plasma of the rare gas is generated in the processing chamber 12. A negative DC voltage may be applied to the upper electrode 30 in at least any one of the steps STB2 to STB4.

In the sequence SQB, the steps STB1 to STB4 are sequentially executed while maintaining the plasma of the rare gas. In other words, in the sequence SQB, the purge process, like the steps STP1 to STP4 of the sequence SQA, is not executed.

In the sequence SQB, as shown in FIG. 10, a plasma of the rare gas is generated during the steps STB1 to STB4. In other words, the rare gas is supplied into the processing chamber 12 and the plasma of the rare gas is generated during the execution of the sequence SQB. In one embodiment, before the execution of the step STB1 of the first sequence SQB, the rare gas is supplied into the processing chamber 12 and the high frequency power for plasma generation is supplied. Accordingly, the plasma of the rare gas is generated. Then, a plasma of the first gas may be generated by supplying a halogenated silicon gas into the processing chamber 12.

In the method MTB including the sequence SQB, the halogenated silicon gas supplied into the processing chamber in the step STB1 is discharged from the space in the processing chamber 12 during the generation of the plasma of the rare gas in the step STB2. In an embodiment of the step STB2, plasma emission in the processing chamber 12 is measured by optical emission spectroscopy (OES). When the plasma emission of a halogenated silicon gas is hardly observed, the step STB2 can be completed. The oxygen gas supplied into the processing chamber 12 in the step STB3 is discharged from the space in the processing chamber 12 during the generation of the plasma of the rare gas in the step STB4. In this embodiment of the step STB4, the plasma emission in the processing chamber 12 is measured by OES. When the plasma emission of the oxygen gas is hardly observed, the step STB4 can be completed.

As clear from the above description, in the method MTB, it is not necessary to perform a purge process. Further, a period of time for stabilizing a plasma can be omitted. In other words, a period of time for stabilizing a plasma is not required before the execution of each step using a plasma. Therefore, the throughput can be improved by using the method MTB.

In this method MTB, a flow rate of the rare gas supplied during the execution of the sequence SQB may be constant or may vary. In one embodiment, as shown in FIG. 10, a flow rate of the rare gas supplied into the processing chamber 12 in the step STB4 is set to be greater than a flow rate of the rare gas supplied into the processing chamber 12 in the step STB3. Accordingly, the oxygen gas used in the step STB3 can be discharged quickly from the space in the processing chamber 12. As a result, the throughput is further improved.

In one embodiment, the flow rate of the rare gas supplied into the processing chamber 12 in the step STB4 may be set to be five times greater than the flow rate of the rare gas supplied into the processing chamber 12 in the step STB3. By using the rare gas of such a flow rate in the step STB4, the oxygen gas used in the step STB3 can be discharged quickly from the space in the processing chamber 12.

Figure 11:
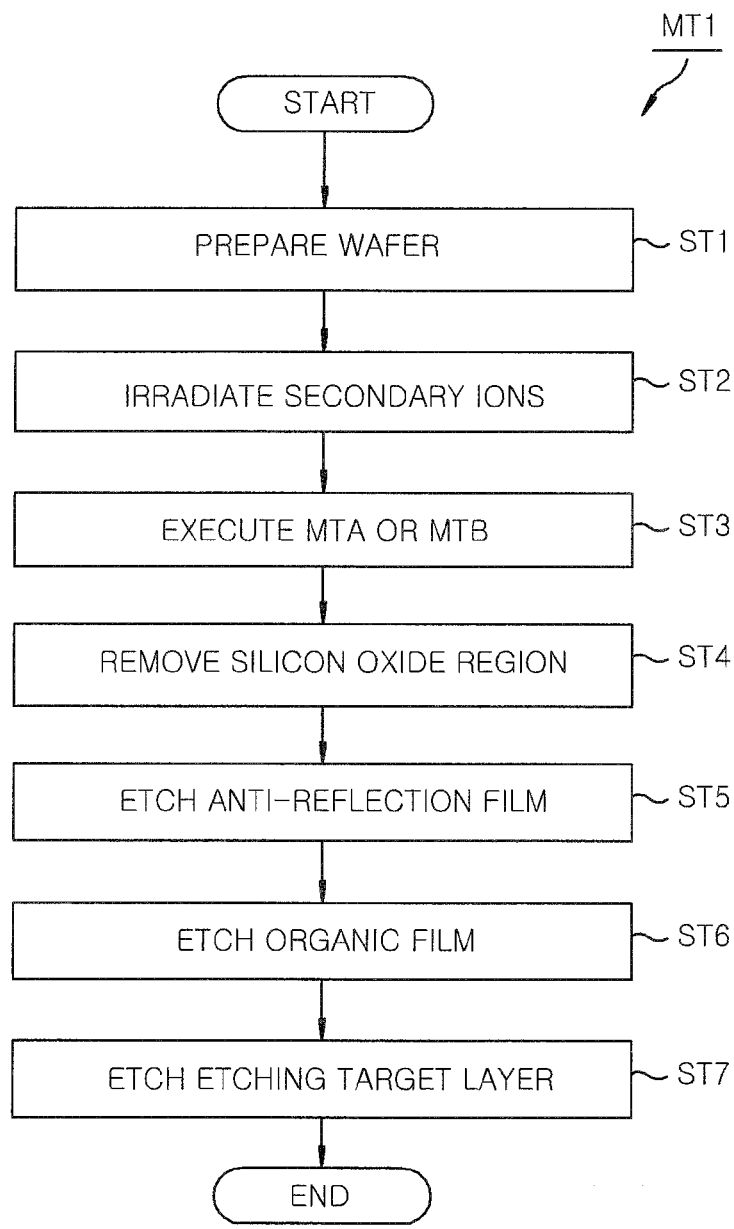
FIG. 11 is a flowchart showing an embodiment of a method for processing a target object, which includes the method shown in FIG. 1 or the method shown in FIG. 9.

Hereinafter, an embodiment of a method for processing a target object which includes the method MTA or the method MTB will be described. FIG. 11 is a flowchart of the embodiment of the method for processing a target object which includes the method shown in FIG. 1 or the method shown in FIG. 9. FIGS. 12A to 13C are cross sectional views showing states of the target object after the respective steps of the method shown in FIG. 11.

Figure 12A:
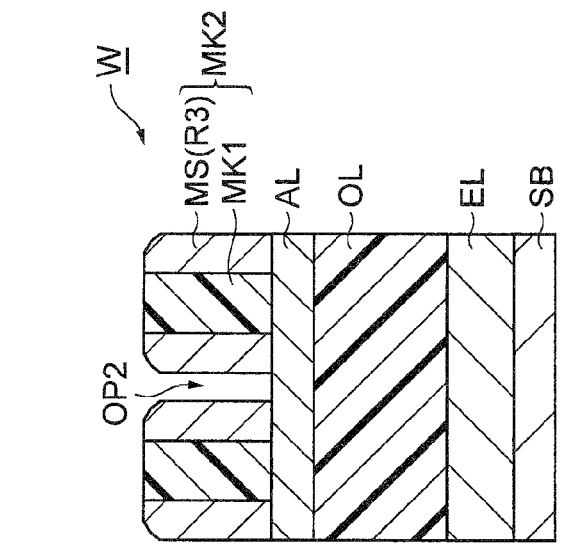
FIGS. 12A to 13C are cross sectional views showing states of a target object after executions of respective steps of the method shown in FIG. 11.

In the method MT1 shown in FIG. 11, first, a wafer W is prepared in the step ST1. The wafer W prepared in the step ST1 includes, as a base region UR, a substrate SB, an etching target layer EL, an organic film OL, and an anti-reflection film AL, and further includes a mask MK1 as shown in FIG. 12A. The etching target layer EL is formed on the substrate SB. In one embodiment, the etching target layer EL is made of silicon oxide ($SiO_2$). The organic film OL is formed on the etching target layer EL. The organic film OL is a layer containing carbon and is a SOH (spin on hard mask) layer, for example. The anti-reflection film AL is a silicon-containing anti-reflection film provided on the organic film OL.

The mask MK1 is provided on the anti-reflection film AL. The mask MK1 is a resist mask made of a resist material and formed by patterning a resist layer by a photolithography technique. The mask MK1 partially covers the anti-reflection film AL. Further, the mask MK1 provides an opening OP1 through which a part of the anti-reflection film AL is exposed. A pattern of the mask MK1 is, e.g., a line and space pattern. The mask MK1 may have a pattern that provides a circular opening or an oval-shaped opening when seen from the top.

In the step ST1, a wafer W shown in FIG. 12A is prepared. The wafer W is accommodated in the processing chamber 12 of the plasma processing apparatus 10 and mounted on the mounting table PD.

In the method MT1, next, a step ST2 is executed. In the step ST2, secondary electrons are irradiated to the wafer W. Specifically, hydrogen gas and a rare gas are supplied into the processing chamber 12, and a high frequency power is supplied from the first high frequency power supply 62. Accordingly, a plasma is generated. Further, a negative DC voltage is applied to the upper electrode 30 by the power supply 70. As a consequence, positive ions in the processing space S are attracted to the upper electrode 30 and collide with the top plate 34 of the upper electrode 30. Due to the collision of the positive ions with the top plate 34, secondary electrons are emitted from the top plate 34. The emitted secondary electrons are irradiated to the wafer W, so that the mask MK1 is modified. When the level of the magnitude of the negative DC voltage applied to the upper electrode 30 is high, silicon forming the top plate 34 is emitted together with the secondary electrons due to the collision of the positive ions with the top plate 34. The emitted silicon is bonded with oxygen emitted from the components of the plasma processing apparatus 10 which are exposed to the plasma. The oxygen is emitted from the components, e.g., the supporting portion 14 and the insulating shielding member 32. Due to the bonding between silicon and oxygen, a silicon oxide compound is generated and deposited on the wafer W. As a consequence, the mask MK1 is protected. Due to the effect of the modification and the protection, the damage to the mask MK1 by a subsequent step is suppressed. In the step ST2, in order to form a protective film or perform modification using irradiation of the secondary electrons, the emission of silicon may be suppressed by minimizing the high frequency bias power from the second high frequency power supply 64.

Figure 12B:
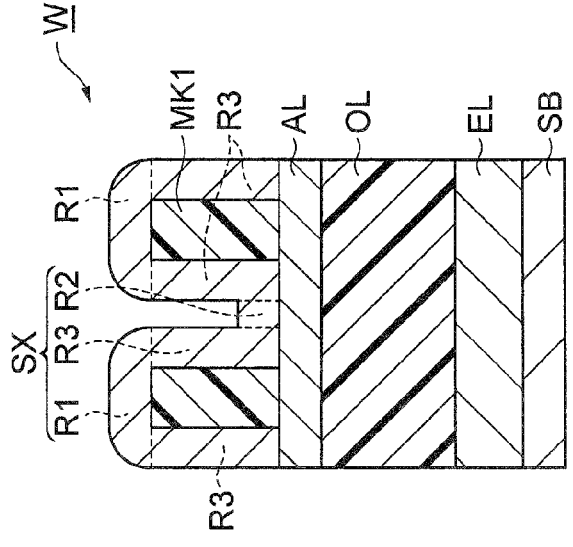

Next, in the method MT1, a step ST3 is executed. In the step ST3, the aforementioned method MTA or MTB is executed. Accordingly, as shown in FIG. 12B, a silicon oxide film SX is formed on the surface of the mask MK1 and the anti-reflection film AL. As shown in FIG. 7B, the silicon oxide film SX is selectively formed on the inner wall surface of the plasma processing apparatus 10 except the bottom surface 34i of the top plate 34.

Figure 12C:
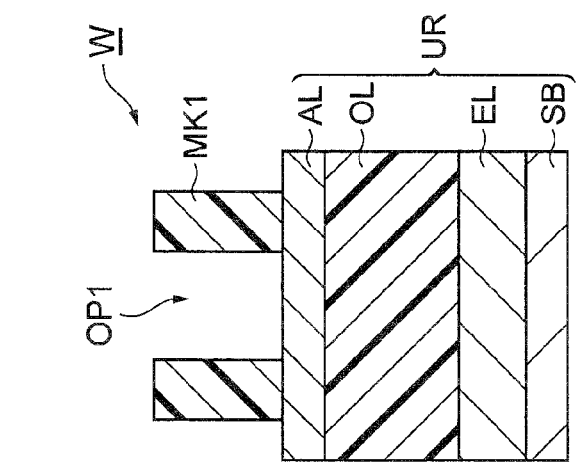

Next, in the method MT1, a step ST4 is executed. In the step ST4, the silicon oxide film SX on the wafer W is etched such that the region R3, among the regions R1 to R3, remains. In other words, the silicon oxide film SX on the wafer W is etched such that the regions R1 and R2 are removed. In order to remove the regions R1 and R2, anisotropic etching conditions are required. Therefore, in the step ST4, a processing gas containing a fluorocarbon gas is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62, so that a plasma is generated. A high frequency bias power is supplied from the second high frequency power supply 64. Accordingly, a plasma of the fluorocarbon gas is generated. Active species containing fluorine in the generated plasma are attracted vertically by the high frequency bias power, so that the regions R1 and R2 are etched first. As a result, as shown in FIG. 12C, the regions R1 and R2 are removed and the remaining region R3 becomes a mask MS. The mask MS forms, together with the mask MK1, a mask MK2 that reduces the width of the opening OP1 of the mask MK1. Due to the mask MK2, an opening OP2 having a width smaller than that of the opening OP1 is provided.

Figure 13A:
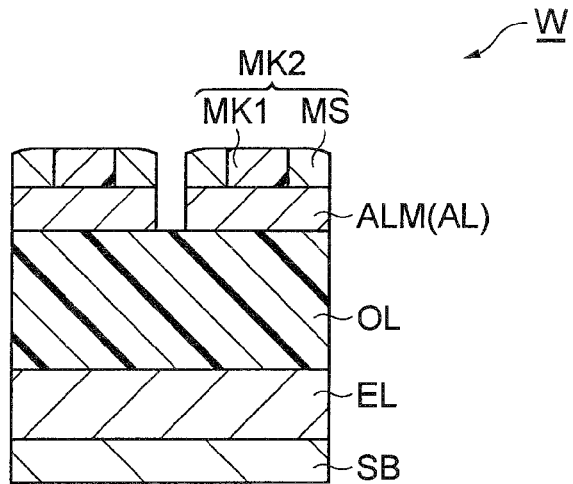

Next, in a step ST5, the anti-reflection film AL is etched. Specifically, a processing gas containing a fluorocarbon gas is supplied into the processing chamber 12 from a gas source selected among a plurality of gas sources of the gas source group 40. By operating the gas exhaust unit 50, a pressure in the processing chamber 12 is set to a predetermined level. Further, a high frequency power is supplied from the first high frequency power supply 62. A high frequency bias power is supplied from the second high frequency power supply 64. Accordingly, a plasma of the fluorocarbon gas is generated. Active species containing fluorine in the generated plasma etch the region exposed through the mask MK2 in the entire region of the anti-reflection film AL. As a result, as shown in FIG. 13A, the anti-reflection film AL becomes a mask ALM. Then, the mask MK2 may be removed.

Figure 13B:
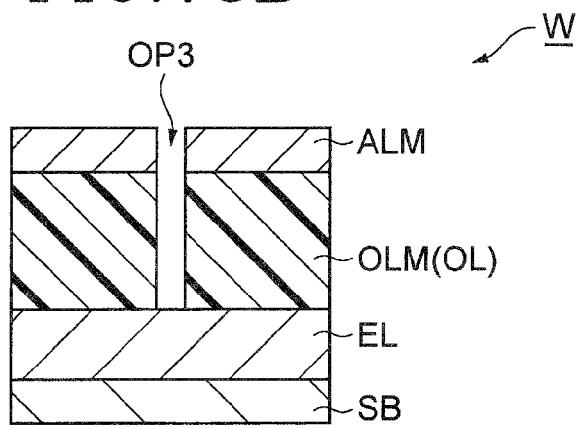

Next, in a step ST6, the organic film OL is etched. Specifically, a processing gas containing oxygen gas is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62. A high frequency bias power is supplied from the second high frequency power supply 64. Accordingly, a plasma of the processing gas containing oxygen gas is generated. Active species of oxygen in the generated plasma etch the region exposed through the mask ALM in the entire region of the organic film OL. As a consequence, as shown in FIG. 13B, the organic film OL becomes a mask OLM. A width of an opening OP3 provided by the mask OLM is substantially the same as that of the opening OP2 (see FIG. 12C). As a gas for etching the organic film OL, a processing gas containing nitrogen gas and hydrogen gas may be used.

If the inner wall surface of the plasma processing apparatus 10 is not covered by the silicon oxide film SX, the active species generated during the execution of the step ST6 may damage the inner wall surface of the plasma processing apparatus 10, and particles may be emitted from the inner wall surface. However, when the step ST6 of the method MT1 is executed, the generation of particles from the inner wall surface is suppressed because the inner wall surface of the plasma processing apparatus 10 is already covered by the silicon oxide film SX.

Figure 13C:
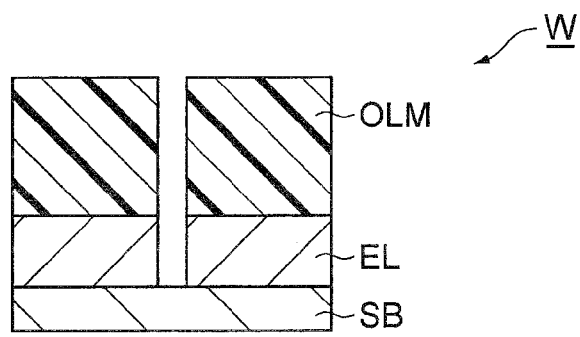

Next, in a step ST7, the etching target layer EL is etched. Specifically, a processing gas is supplied into the processing chamber 12 from a gas source selected among a plurality of gas sources of the gas source group 40. The processing gas may be appropriately selected to etch a material forming the etching target layer EL, i.e., silicon oxide. For example, the processing gas may contain a fluorocarbon gas. By operating the gas exhaust unit 50, a pressure in the space in the processing chamber 12 is set to a predetermined level. In the step ST7, a high frequency power is supplied from the first high frequency power supply 62. Further, a high frequency bias power is supplied from the second high frequency power supply 64. Accordingly, a plasma of the processing gas is generated. Active species in the generated plasma etch the region exposed through the mask OLM in the entire region of the etching target layer EL. Hence, as shown in FIG. 13C, the pattern of the mask OLM is transferred to the etching target layer EL. In the step ST7, the silicon oxide film SX formed on the inner wall surface of the plasma processing apparatus 10 is removed. As a consequence, after the step ST7 is completed, the inner wall surface of the plasma processing apparatus 10 becomes substantially the same as the initial state shown in FIG. 3B.

In this method MT1, the steps ST2 to ST7, i.e., all steps from the formation of the mask based on the resist mask to the etching of the etching target layer, can be executed by using a single plasma processing apparatus 10. Therefore, a period of time for transferring the wafer W can be omitted and the high-resolution etching of the etching target layer EL can be realized with a high throughput.

Figure 14:
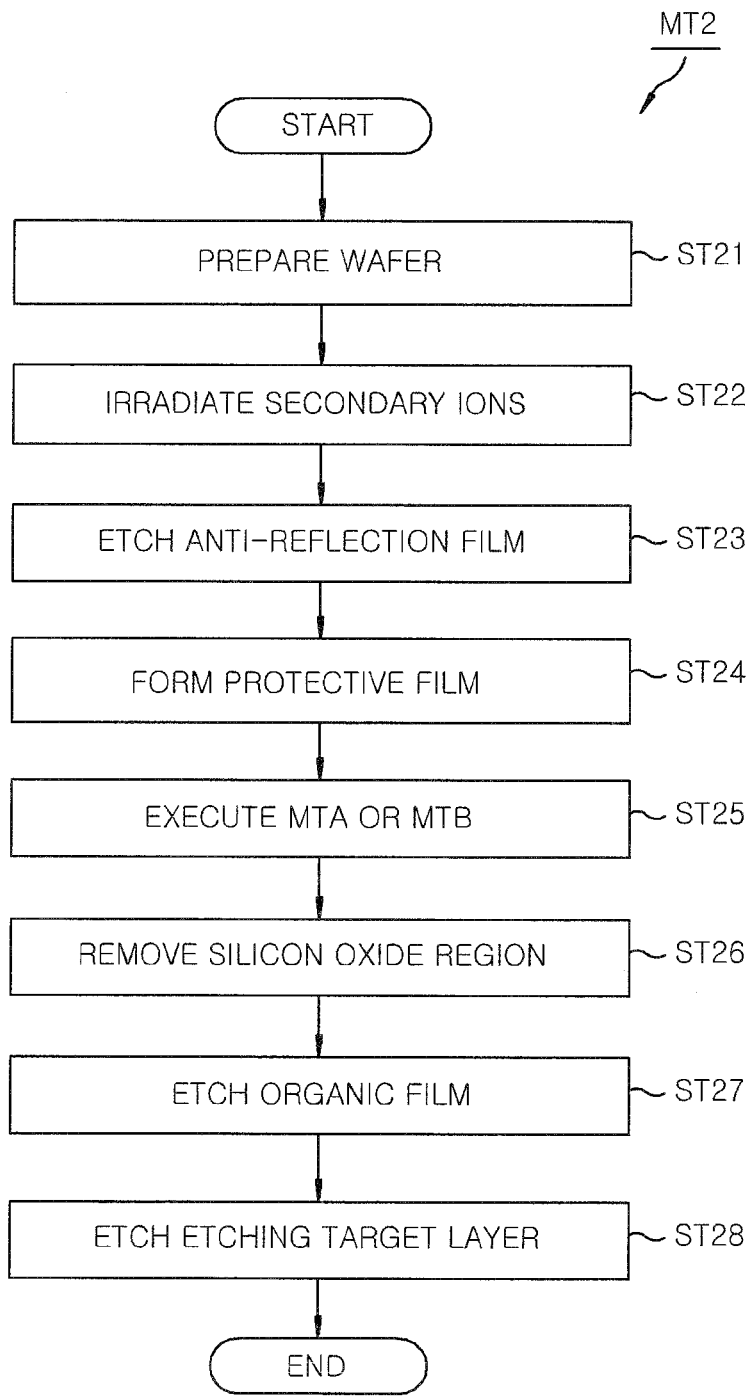
FIG. 14 is a flowchart showing another embodiment of the method for processing a target object which includes the method shown in FIG. 1 or the method shown in FIG. 9.

Hereinafter, another embodiment of the method for processing a target object which includes the method MTA or the method MTB will be described. FIG. 14 is a flowchart showing another embodiment of the method for processing a target object which includes the method shown in FIG. 1 or the method shown in FIG. 9. FIGS. 15 and 16 are cross sectional views showing states of the target object after the execution of the respective steps of the method shown in FIG. 14.

In a method MT2 shown in FIG. 14, first, a step ST21 is executed. The step ST21 is the same as the step ST1 of the method MT1. Therefore, in the step ST21, a wafer W shown in FIG. 15A, identical to that shown in FIG. 12A, is prepared. The wafer W is loaded into the processing chamber 12 and mounted on the mounting table PD.

Next, in the method MT2, a step ST22 identical to the step ST2 of the method MT1 is executed. In other words, secondary electrons are irradiated to the wafer W. As a consequence, the mask MK1 is modified. When the level of the magnitude of the negative DC voltage applied to the upper electrode 30 is high, a silicon oxide compound is generated by bonding between silicon emitted from the top plate 34 by the sputtering of the top plate 34 and oxygen emitted from the components of the plasma processing apparatus 10 which are exposed to the plasma, as described in the step ST2. The silicon oxide compound thus generated is deposited on the wafer W and protects the mask MK1.

Next, in a step ST23, the anti-reflection film AL is etched. Specifically, a processing gas containing a fluorocarbon gas is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62. A high frequency bias power is supplied from the second high frequency power supply 64. Accordingly, a plasma of the fluorocarbon gas is generated. Active species containing fluorine in the generated plasma etch the region exposed through the mask MK1 in the entire region of the anti-reflection film AL. As a result, the anti-reflection film AL becomes a mask ALM2 as shown in FIG. 15B.

Figure 15A:
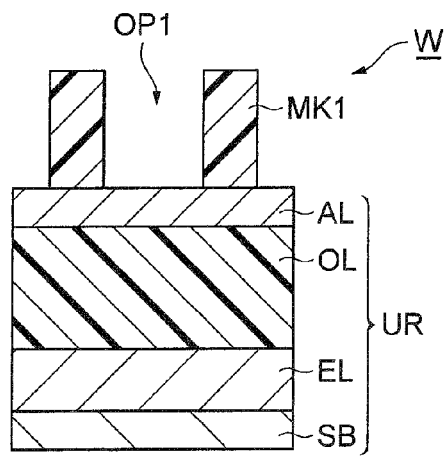
FIGS. 15A to 16C are cross sectional views showing states of the target object after executions of respective steps of the method shown in FIG. 14.
Figure 15B:
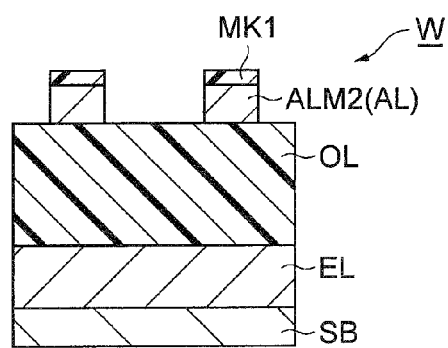

Next, in a step ST24, a protective film PF is formed on the surface of the wafer W shown in FIG. 15B. The protective film PF is formed to protect the organic film OL from the active species of oxygen which are generated during the implementation of the method MTA or MTB.

Figure 15C:
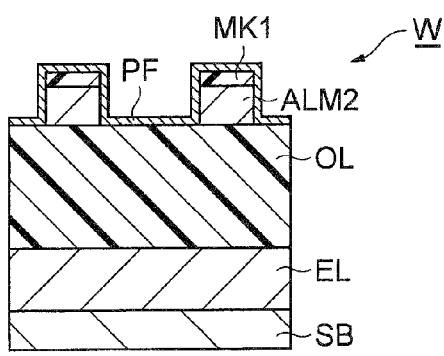

In an embodiment of the step ST24, a gaseous mixture containing hydrogen gas and a rare gas, for example, is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62. Accordingly, a plasma is generated in the processing chamber 12. A negative DC voltage is applied from the power supply 70 to the upper electrode 30. As a consequence, positive ions in the plasma collide with the top plate 34 and silicon is emitted from the top plate 34. Further, oxygen is emitted from the components of the plasma processing apparatus 10 which are exposed to the plasma. Due to the bonding between the emitted oxygen and the silicon emitted from the top plate 34, a silicon oxide is generated. The silicon oxide is deposited on the wafer W, thereby forming a protective film PF made of silicon oxide as shown in FIG. 15C.

In another embodiment of the step ST24, a gaseous mixture containing a halogenated silicon gas and oxygen gas is supplied into the processing chamber 12 from a gas source selected among a plurality of gas sources of the gas source group 40. Further, a high frequency power is supplied from the first high frequency power supply 62. By operating the gas exhaust unit 50, a pressure in the space in the processing chamber 12 is set to a predetermined level. Accordingly, a silicon oxide is generated and deposited on the wafer W. As a result, a protective film PF is formed as shown in FIG. 15C.

Figure 15D:
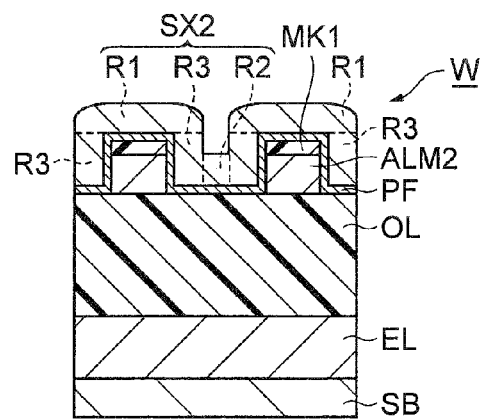

Next, in the MT2, a step ST25 is executed. In the step ST25, the aforementioned method MTA or MTB is performed. Accordingly, as shown in FIG. 15D, a silicon oxide film SX2 is formed on the surface of the wafer W. The silicon oxide film SX2 includes regions R1 to R3. The region R3 extends along the side surfaces of the masks MK1 and ALM2 on the corresponding side surfaces. The region R3 extends from the surface of the protective film PF formed on the organic film OL to a position under the region R1. The region R1 extends on the top surface of the mask MK1 and on the region R3. The region R2 extends between the adjacent regions R3 and on the surface of the organic film OL (i.e., on the protective film PF on the organic film OL). In the step ST25, the silicon oxide film is selectively formed on the inner wall surface of the plasma processing apparatus 10 except the bottom surface 34i of the top plate 34, i.e., on a region indicated by a notation SX in FIG. 7B.

Figure 16A:
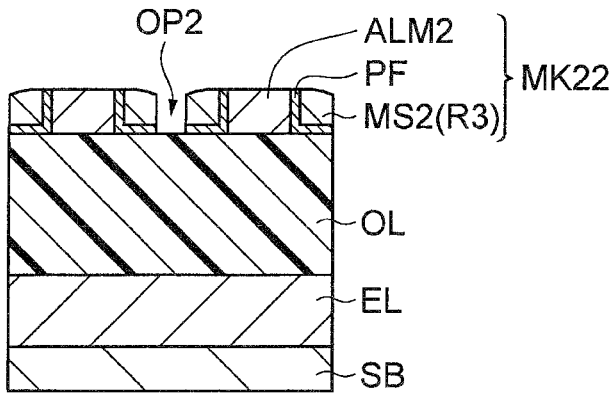

Next, in the method MT2, a step ST26 is executed. In the step ST26, the silicon oxide film SX2 on the wafer W is etched such that the region R3, among the regions R1 to R3, remains. In other words, the silicon oxide film SX2 is etched such that the regions R1 and R2 are removed. Specifically, the processing gas containing a fluorocarbon gas is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62. A high frequency bias power is supplied from the second high frequency power supply 64. Accordingly, a plasma of the fluorocarbon gas is generated. Active species containing fluorine in the generated plasma are attracted vertically by the high frequency bias power, so that the regions R1 and R2 are etched first. As a result, as shown in FIG. 16A, the regions R1 and R2 are removed and the remaining region R3 becomes a mask MS2. The mask MS2 forms, together with the mask ALM2, a mask MK22 that reduces the width of the opening OP1 of the mask MK1. Due to the mask MK22, an opening OP2 having a width smaller than that of the opening OP1 is provided.

Figure 16B:
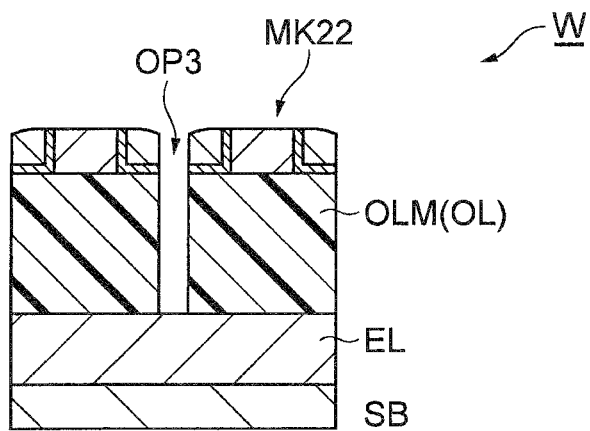

Next, in a step ST27, the organic film OL is etched. Specifically, a processing gas containing oxygen gas is supplied into the processing chamber 12 from a gas source selected among a plurality of gas sources of the gas source group 40. By operating the gas exhaust unit 50, a pressure in the space in the processing chamber 12 is set to a predetermined level. Further, a high frequency power is supplied from the first high frequency power supply 62. A high frequency bias power is supplied from the second high frequency power supply 64. Accordingly, a plasma of the processing gas containing oxygen gas is generated. Active species of oxygen in the generated plasma etch the region exposed through the mask MK22 in the entire region of the organic film OL. As a consequence, the organic film OL becomes a mask OML as shown in FIG. 16B. The width of the opening OP3 provided by the mask OLM is substantially the same as that of the opening OP2 (see FIG. 12A). As a gas for etching the organic film OL, a processing gas containing nitrogen gas and hydrogen gas may be used. In the step ST27, as in the step ST6 of the method MT1, the inner wall surface of the plasma processing apparatus 10 is covered by the silicon oxide film, so that the generation of particles from the inner wall surface is suppressed.

Figure 16C:
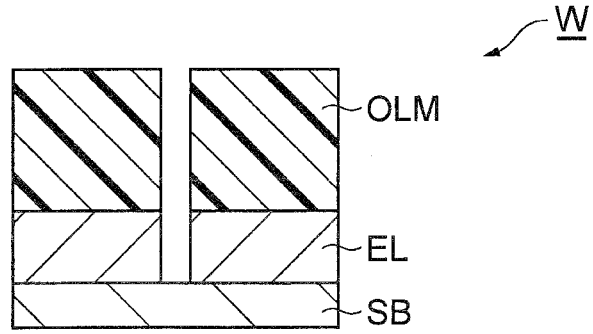

Next, in a step ST28, the etching target layer EL is etched. Specifically, a processing gas is supplied into the processing chamber 12 from a gas source selected among a plurality of gas sources of the gas source group 40. The processing gas may be appropriately selected to etch a material forming the etching target layer EL, i.e., silicon oxide. For example, the processing gas may contain a fluorocarbon gas. In the step ST28, by operating the gas exhaust unit 50, a pressure in the space in the processing chamber 12 is set to a predetermined level. Further, in the step ST28, a high frequency power is supplied from the first high frequency power supply 62. A high frequency bias power is supplied from the second high frequency power supply 64. Accordingly, a plasma of the processing gas is generated. Active species in the generated plasma etch the region exposed through the mask OLM in the entire region of the etching target layer EL. As a consequence, as shown in FIG. 16C, the pattern of the mask OLM is transferred to the etching target layer EL. In the step ST28, the silicon oxide film formed on the inner wall surface of the plasma processing apparatus 10 is removed. As a result, after the step ST28 is completed, the state of the inner wall surface of the plasma processing apparatus 10 becomes substantially the same as the initial state shown in FIG. 3B.

In the method MT2, the steps ST22 to ST28, i.e., the all steps from the formation of the mask based on the resist mask to the etching of the etching target layer, can be performed by using a single plasma processing apparatus 10. Therefore, the transfer time of the wafer W can be omitted. As a result, the high-resolution etching of the etching target layer EL can be realized with a high throughput.

While various embodiments have been described, various modifications can be made without being limited to the above-described embodiments. For example, in the description of the methods MTA, MTB, MT1 and MT2, the example using the plasma processing apparatus 10 has been described. However, the methods MTA, MTB, MT1 and MT2 may also be implemented by using a capacitively coupled plasma processing apparatus including an upper electrode having a top plate made of silicon.

While the disclosure has been shown and described with respect to the embodiments, it will be understood by those skilled in the art that various changes and modifications may be made without departing from the scope of the disclosure as defined in the following claims.

What is claimed is:

1. A method for processing a target object including mask by using a capacitively coupled plasma processing apparatus, which includes a processing chamber that provides a processing space, a lower electrode, a mounting table for mounting the target object thereon, and an upper electrode having a silicon top plate facing the mounting table with the processing space interposed therebetween, the method comprising:
   a first step of supplying a first gas containing a silicon-containing gas into the processing chamber where the target object is accommodated;
   a second step of generating a plasma of a rare gas in the processing chamber after executing the first step;
   a third step of generating a plasma of a second gas containing oxygen gas in the processing chamber after executing the second step; and
   a fourth step of generating a plasma of a rare gas in the processing chamber after executing the third step,
   wherein a silicon oxide film is formed by repeatedly executing a sequence including the first step to the fourth step, and
   wherein a negative DC voltage is applied to the upper electrode in at least any one of the second step to the fourth step.

2. The method of claim 1, wherein the silicon-containing gas is an aminosilane gas and no plasma is generated in the first step.

3. The method of claim 1, wherein the silicon-containing gas is a halogenated silicon gas and a plasma of the first gas is generated in the first step.

4. The method of claim 3, wherein the silicon-containing gas is $SiCl_4$ gas.

5. The method of claim 3, wherein the first gas further contains a rare gas and a plasma of the rare gas is generated in the first step,
   wherein the second gas further contains a rare gas and a plasma of the rare gas is generated in the third step, and
   wherein the first step to the fourth step are sequentially executed while maintaining the plasma of the rare gas.

6. The method of claim 5, wherein a flow rate of the rare gas supplied into the processing chamber in the fourth step is greater than a flow rate of the rare gas supplied into the processing chamber in the third step.

7. The method of claim 3, wherein in the first step, a condition of a high pressure and a low power is set by setting a pressure in the processing chamber to 13.33 Pa or above and a high frequency power for plasma generation to 100 W or less.

8. The method of claim 3, wherein in the first step, a high frequency bias power for ion attraction is not supplied to the lower electrode.

9. The method of claim 1, wherein the target object further includes an organic film and the mask is formed on the organic film, the method further comprising:
   etching the silicon oxide film by a plasma generated in the processing chamber such that a part of the silicon oxide film formed along the sidewall of the mask remains; and
   etching the organic film by a plasma generated in the processing chamber.

10. The method of claim 9, wherein the target object further includes an etching target layer that is a silicon oxide film and the organic film is formed on the etching target layer, the method further comprising:
    after the etching of the organic film, etching the etching target layer by a plasma generated in the processing chamber.

11. The method of claim 9, wherein the target object further includes a silicon-containing anti-reflection film formed on the organic film, and
    wherein the mask is a resist mask formed on the anti-reflection film, the method further comprising:
    between the etching of the silicon oxide film and the etching of the organic film, etching the anti-reflection film by a plasma generated in the processing chamber.

12. The method of claim 11, further comprising: before the repetitive execution of the sequence, generating a plasma in the processing chamber and irradiating secondary electrons to the mask by applying a negative DC voltage to the upper electrode.

13. The method of claim 9, further comprising: before the repetitive execution of the sequence, etching an anti-reflection film, on which a resist mask is formed, by a plasma generated in the processing chamber to make the mask from the anti-reflection film.

14. The method of claim 13, further comprising: before the etching of the anti-reflection film, generating a plasma in the processing chamber and irradiating secondary ions to the resist mask by applying a negative DC voltage to the upper electrode.

15. The method of claim 13, further comprising: after the etching of the anti-reflection film and before the repeated execution of the sequence, forming a protective film made of silicon oxide on the target object.

* * * * *